(12) United States Patent
Kawada

(10) Patent No.: US 11,515,387 B2
(45) Date of Patent: Nov. 29, 2022

(54) METHOD OF MANUFACTURING SILICON CARBIDE SEMICONDUCTOR DEVICE, METHOD OF MANUFACTURING SILICON CARBIDE SUBSTRATE, AND SILICON CARBIDE SUBSTRATE

(71) Applicant: FUJI ELECTRIC CO., LTD., Kawasaki (JP)

(72) Inventor: Yasuyuki Kawada, Nagano (JP)

(73) Assignee: FUJI ELECTRIC CO., LTD., Kawasaki (JP)

(*) Notice: Subject to any disclaimer, the term of this patent is extended or adjusted under 35 U.S.C. 154(b) by 0 days.

(21) Appl. No.: 17/078,237

(22) Filed: Oct. 23, 2020

(65) Prior Publication Data
US 2021/0167167 A1 Jun. 3, 2021

(30) Foreign Application Priority Data
Dec. 2, 2019 (JP) .............................. JP2019-218293

(51) Int. Cl.
*H01L 29/06* (2006.01)
*H01L 29/10* (2006.01)
(Continued)

(52) U.S. Cl.
CPC ...... *H01L 29/0634* (2013.01); *H01L 29/1095* (2013.01); *H01L 29/66068* (2013.01);
(Continued)

(58) Field of Classification Search
CPC ............. H01L 29/0634; H01L 29/1095; H01L 29/66068; H01L 21/0465; H01L 21/0475;
(Continued)

(56) References Cited

U.S. PATENT DOCUMENTS

2006/0284248 A1 12/2006 Saito et al.
2007/0272979 A1* 11/2007 Saito ................... H01L 29/0634
257/E29.328
(Continued)

FOREIGN PATENT DOCUMENTS

| JP | 2007-036213 A | 2/2007 |
|----|---------------|--------|
| JP | 2007-243092 A | 9/2007 |
| JP | 2018-142682 A | 9/2018 |

*Primary Examiner* — Cuong B Nguyen
(74) *Attorney, Agent, or Firm* — Rabin & Berdo, P.C.

(57) ABSTRACT

A method of manufacturing a silicon carbide substrate having a parallel pn layer. The method includes preparing a starting substrate containing silicon carbide, forming a first partial parallel pn layer on the starting substrate by a trench embedding epitaxial process, stacking a second partial parallel pn layer by a multi-stage epitaxial process on the first partial parallel pn layer, and stacking a third partial parallel pn layer on the second partial parallel pn layer by another trench embedding epitaxial process. Each of the first, second and third partial parallel pn layers is formed to include a plurality of first-conductivity-type regions and a plurality of second-conductivity-type regions alternately disposed in parallel to a main surface of the silicon carbide substrate. The first-conductivity-type regions of the first and third partial parallel pn layers face each other in a depth direction of the silicon carbide substrate, and the second-conductivity-type regions partial parallel pn layers face each other in the depth direction.

14 Claims, 18 Drawing Sheets

(51) Int. Cl.
*H01L 29/66* (2006.01)
*H01L 21/04* (2006.01)
*H01L 29/78* (2006.01)
*H01L 29/16* (2006.01)

(52) U.S. Cl.
CPC ...... *H01L 21/0465* (2013.01); *H01L 21/0475* (2013.01); *H01L 29/1608* (2013.01); *H01L 29/7813* (2013.01)

(58) Field of Classification Search
CPC ............. H01L 29/1608; H01L 29/7813; H01L 21/046; H01L 29/0615; H01L 29/0638; H01L 29/0878; H01L 29/7811
See application file for complete search history.

(56) References Cited

U.S. PATENT DOCUMENTS

| | | | |
|---|---|---|---|
| 2014/0264477 A1* | 9/2014 | Bhalla | H01L 29/66909 438/192 |
| 2017/0271442 A1* | 9/2017 | Uehara | H01L 29/0634 |
| 2018/0248002 A1 | 8/2018 | Kawada et al. | |
| 2021/0183995 A1* | 6/2021 | Kobayashi | H01L 29/1095 |

* cited by examiner

FIRST-LAYER (EMBEDDED-TRENCH PARALLEL pn LAYER)

SECOND-LAYER (MULTI-STAGE EPI PARALLEL pn LAYER)

SECOND-LAYER (MULTI-STAGE EPI PARALLEL pn LAYER)

THIRD-LAYER (EMBEDDED-TRENCH PARALLEL pn LAYER)

METHOD OF MANUFACTURING SILICON CARBIDE SEMICONDUCTOR DEVICE, METHOD OF MANUFACTURING SILICON CARBIDE SUBSTRATE, AND SILICON CARBIDE SUBSTRATE

CROSS REFERENCE TO RELATED APPLICATIONS

This application is based upon and claims the benefit of priority of the prior Japanese Patent Application No. 2019-218293, filed on Dec. 2, 2019, the entire contents of which are incorporated herein by reference.

BACKGROUND OF THE INVENTION

1. Field of the Invention

Embodiments of the invention relate to a method of manufacturing a silicon carbide semiconductor device, method of manufacturing a silicon carbide substrate, and a silicon carbide substrate.

2. Description of the Related Art

Conventionally, super junction semiconductor devices having a super junction (SJ) structure in which a drift layer is a parallel pn layer in which p-type regions and n-type regions of increased impurity concentrations are disposed adjacent to one another so as to repeatedly alternate one another in a direction parallel to a main surface of a semiconductor substrate. A multi-stage epitaxial (multi-epitaxial) process or a trench embedding epitaxial process is used in forming the drift layer having a SJ structure.

In forming the SJ structure by a multi-stage epitaxial process, a thickness of an n-type epitaxial layer is increased in stages by multiple stages of epitaxial growth until a predetermined thickness is achieved, and an ion implantation for selectively forming the p-type regions is repeatedly performed for each stage of epitaxial growth performed. In a trench embedding epitaxial process, trenches are formed in an n-type epitaxial layer formed to have a predetermined thickness by a single stage of epitaxial growth and a p-type epitaxial layer is embedded in the trenches.

In a high-voltage super junction semiconductor device using silicon carbide (SiC) as a semiconductor material, the thickness of the drift layer has to be increased. Therefore, rather than a multi-stage epitaxial process of increasing the thickness to a predetermined thickness in stages by multiple stages of epitaxial growth, the epitaxial layer that forms the drift layer is manufactured (fabricated) more easily using a trench embedding epitaxial process of forming an epitaxial layer that forms the drift layer to have a predetermined thickness by a single stage of epitaxial growth and after forming trenches, embedding the trenches by epitaxial growth.

When the trench embedding epitaxial process is used, the SJ structure is formed by forming trenches in the n-type epitaxial layer that forms the drift layer and embedding a p-type epitaxial layer in the trenches. The thicker is the drift layer, the deeper the trenches have to be formed and therefore, both forming the trenches by etching (hereinafter, trench etching) and completely embedding the trenches with the epitaxial layer are difficult.

One reason that trench etching becomes difficult as the thickness of the drift layer increases is that the trench etching is a dry etching that is an anisotropic etching. The deeper is the trench, the more difficult it is to form, by dry etching, a favorable trench-shape in which sidewalls of the trench are substantially orthogonal to the main surface of the semiconductor substrate because the width of the trench tends to increase near an upper part of the opening and decrease near a bottom (bottom part of the opening). Further, roughness (height difference of unevenness) of the trench sidewalls tends to increase.

In addition, a thickness of an oxide film ($SiO_2$ film) used as a trench etching mask also has to be increased so that the oxide film does not disappear during the dry etching. Therefore, both deposition (formation) of the oxide film used as the trench etching mask and dry etching to selectively remove the oxide film to form openings at parts corresponding to trench formation regions are difficult. A further problem arises in that stress occurring in the semiconductor substrate due to the oxide film increases.

Further, the deeper is the depth of the trenches, the higher is the aspect ratio (=depth of trench/width of trench) of the trenches and therefore, the longer is the epitaxial growth period. In addition, voids (cavities) tend to occur in a trench due to the epitaxially grown epitaxial layer becoming connected to both sidewall walls of the trench near the upper part of the opening of the trench and blocking the upper part of the opening of the trench, whereby the epitaxial layer cannot be embedded.

For such reasons, in a high-voltage super junction semiconductor device using silicon carbide as a semiconductor material, forming the drift layer to have a SJ structure in substantially an entire area of the drift layer in a depth direction (hereinafter, full SJ structure) is difficult whereas forming the drift layer to have a SJ structure only in a front portion (upper portion) of the semiconductor substrate (hereinafter, partial SJ structure) is realistic. A structure of a conventional super junction semiconductor device having a partial SJ structure will be described. FIG. 22 is a cross-sectional view of the conventional silicon carbide semiconductor device.

A conventional silicon carbide semiconductor device 110 depicted in FIG. 22 is a super junction metal oxide semiconductor field effect transistor (MOSFET) having a planar gate structure in which a drift layer 102 having a partial SJ structure is provided in a semiconductor substrate 120 containing silicon carbide. The semiconductor substrate 120 is formed by sequentially stacking epitaxial layers 122, 123, 124 on an $n^+$-type starting substrate 121. The $n^+$-type starting substrate 121 is an $n^+$-type drain region 101.

The epitaxial layers 122, 123 configure the drift layer 102 having a partial SJ structure. The epitaxial layer 122 of an $n^-$-type is a portion of the drift layer 102 closest to a drain electrode and accounts for at least half of the thickness of the drift layer 102. The epitaxial layer 122 of an $n^-$-type is a normal $n^-$-type drift region 102a without the SJ structure. When the SJ structure is formed by the trench embedding epitaxial process, in relation to the width of the trenches and embedding by epitaxial growth, the depth of the trenches of the SJ structure is limited to a range from 20 μm to 25 μm.

In this manner, the depth of the trenches of the SJ structure by the trench embedding epitaxial process is limited and therefore, when the thickness of the drift layer 102 is 65 μm and the trenches of the SJ structure are of a depth in a range from 20 μm to 25 μm, the thickness of the normal $n^-$-type drift region 102a without the SJ structure is in a range from about 45 μm to 40 μm. The epitaxial layer 123 is a parallel pn layer 105 in which n-type regions 103 and p-type regions 104 are disposed adjacent to one another so as to repeatedly alternate one another in a direction parallel to a main surface of the semiconductor substrate 120 and is a portion of the drift layer 102 closest to a source electrode.

In the epitaxial layer 124 of an n-type, p-type base regions 106 are selectively provided adjacent to the p-type regions 104 along the depth direction. Portions of the epitaxial layer 124 of an n-type excluding the p-type base regions 106 are Junction FET (JFET) regions 109. Reference numerals 107, 108, 111, 112, 113, 114, and 115 are $n^+$-type source regions, $p^+$-type contact regions, gate insulating films, gate electrodes, an interlayer insulating film, the source electrode, and the drain electrode.

As a method of forming the conventional SJ structure, a method has been proposed according to which a gas containing a p-type third dopant and an n-type third dopant taken-in to atomic positions differing from those of the p-type third dopant is introduced and a p-type epitaxial layer is epitaxially grown, whereby in trenches formed in the n-type epitaxial layer and having a high aspect ratio (in a range from 3 to 15), a p-type epitaxial layer having a uniform carrier concentration distribution is embedded free of cavities (for example, refer to Japanese Laid-Open Patent Publication No. 2018-142682).

SUMMARY OF THE INVENTION

According to an embodiment of the invention, a method of manufacturing a silicon carbide substrate having a parallel pn layer, includes preparing a starting substrate containing silicon carbide; performing a first stacking process of forming a first partial parallel pn layer on the starting substrate by a trench embedding epitaxial process, the first partial parallel pn layer forming a first portion of the parallel pn layer; performing a second stacking process of stacking a second partial parallel pn layer by a multi-stage epitaxial process on the first partial parallel pn layer, the second partial parallel pn layer forming a second portion of the parallel pn layer; and performing a third stacking process of stacking a third partial parallel pn layer on the second partial parallel pn layer by another trench embedding epitaxial process, the third partial parallel pn layer being a third portion of the parallel pn layer. Each of the first, second and third partial parallel pn layers is formed to include a plurality of first-conductivity-type regions and a plurality of second-conductivity-type regions alternately disposed in parallel to a main surface of the silicon carbide substrate. The first-conductivity-type regions of the first and second partial parallel pn layers at least partially face each other in a depth direction of the silicon carbide substrate, and the second-conductivity-type regions of the first and second partial parallel pn layers at least partially face each other in the depth direction. The first-conductivity-type regions of the first and third partial parallel pn layers face each other in the depth direction of the silicon carbide substrate, and the second-conductivity-type regions of the first and third partial parallel pn layers face each other in the depth direction.

In the embodiment, the first stacking process includes: epitaxially growing a first epitaxial layer of a first conductivity type containing silicon carbide, forming a plurality of first trenches reaching a predetermined depth from a surface of the first epitaxial layer, and leaving, as the first-conductivity-type regions of the first partial parallel pn layer, portions of the first epitaxial layer between adjacent first trenches among the first trenches, and embedding a second epitaxial layer of a second conductivity type in the first trenches to form the second-conductivity-type regions of the first partial parallel pn layer, the second epitaxial layer and the portions of the first epitaxial layer left between the adjacent first trenches forming the first partial parallel pn layer.

In the embodiment, the first-conductivity-type regions and the second-conductivity-type regions in each of the first, second and third partial parallel pn layers extend in a striped pattern parallel to the main surface, and are disposed to alternate one another along a direction orthogonal to a direction along which the striped pattern extends. The second stacking process includes forming the second partial parallel pn layer such that the direction along which the striped pattern of the first-conductivity-type regions and the second-conductivity-type regions therein extends forms an angle of at least 45 degrees with a direction along which the striped pattern of the first-conductivity-type regions and the second-conductivity-type regions of the first partial parallel pn layer extends.

In the embodiment, the direction along which the striped pattern of the first-conductivity-type regions and the second-conductivity-type regions of the second partial parallel pn layer extends is orthogonal to the direction along which the striped pattern of the first-conductivity-type regions and the second-conductivity-type regions of the first partial parallel pn layer extends.

In the embodiment, the second stacking process includes: epitaxially growing a third epitaxial layer of a first conductivity type containing silicon carbide, and ion-implanting an impurity of a second conductivity type in the third epitaxial layer to selectively form a plurality of diffusion regions, which constitute the second-conductivity-type regions of the second partial parallel pn layer, portions of the third epitaxial layer excluding the diffusion regions constituting the first-conductivity-type regions of the second partial parallel pn layer.

In the embodiment, the second stacking process includes: epitaxially growing a third epitaxial layer of a first conductivity type containing silicon carbide, and ion-implanting an impurity of a second conductivity type in the third epitaxial layer to selectively form a plurality of first diffusion regions, which constitute the second-conductivity-type regions of the second partial parallel pn layer, and ion-implanting an impurity of the first conductivity type in the third epitaxial layer to selectively form a plurality of second diffusion regions, which constitute the first-conductivity-type regions of the second partial parallel pn layer, an impurity concentration of the first-conductivity-type regions being higher than that of the third epitaxial layer.

In the embodiment, the third stacking process includes: epitaxially growing a fourth epitaxial layer of a first conductivity type containing silicon carbide, forming a plurality of second trenches reaching the second partial parallel pn layer from a surface of the fourth epitaxial layer to terminate in the second partial parallel pn layer, and leaving, as the first-conductivity-type regions of the third partial parallel pn layer, portions of the fourth epitaxial layer between adjacent second trenches among the second trenches, and embedding a fifth epitaxial layer of a second conductivity type in the second trenches to form the second-conductivity-type regions of the third partial parallel pn layer, the fifth epitaxial layer and the portions of the fourth epitaxial layer left between adjacent second trenches forming the third partial parallel pn layer.

In the embodiment, the method further includes a first planarization process of planarizing a surface of the first partial parallel pn layer after the first stacking process but before the third stacking process.

In the embodiment, the method further includes a second planarization process of planarizing a surface of the third partial parallel pn layer after the third stacking process.

According to another embodiment of the invention, a method of manufacturing a silicon carbide semiconductor device, includes forming a drift layer of the silicon carbide semiconductor device, by manufacturing a silicon carbide substrate using the method of claim 1, the drift layer having a thickness of at least 30 μm. In the drift layer, the parallel pn layer has a thickness that is at least 80% of the thickness of the drift layer.

According to another embodiment of the invention, a silicon carbide substrate, including a starting substrate containing silicon carbide; a parallel pn layer including a first partial parallel pn layer stacked on the starting substrate, a second partial parallel pn layer stacked on the first partial parallel pn layer, and a third partial parallel pn layer stacked on the second partial parallel pn layer. Each of the first, second and third partial parallel pn layers has a plurality of first-conductivity-type regions and a plurality of second-conductivity-type regions alternately disposed in parallel to a main surface of the silicon carbide substrate. The first-conductivity-type regions and the second-conductivity-type regions of the third partial parallel pn layer are respectively adjacent to the first-conductivity-type regions and the second-conductivity-type regions of the second partial parallel pn layer. The first-conductivity-type regions of the first and third partial parallel pn layers face each other in a depth direction of the silicon carbide substrate, and the second-conductivity-type regions the first and third partial parallel pn layers face each other in the depth direction. Crystal defects are formed in the second-conductivity-type regions of the second partial parallel pn layer or in an entire area of the second partial parallel pn layer.

In the embodiment, the first partial parallel pn layer includes a first epitaxial layer of a first conductivity type containing silicon carbide, a plurality of first trenches reaching a predetermined depth from a surface of the first epitaxial layer, and a second epitaxial layer of a second conductivity type, embedded in the first trenches. Portions of the first epitaxial layer between adjacent first trenches among the first trenches constitute the first-conductivity-type regions of the first partial parallel pn layer, and the second epitaxial layer embedded in the first trenches constitute the second-conductivity-type regions of the first partial parallel pn layer.

In the embodiment, the second partial parallel pn layer includes a third epitaxial layer of the first conductivity type containing silicon carbide, and a plurality of diffusion regions, each containing an impurity of the second conductivity type, introduced in the third epitaxial layer. The plurality of diffusion regions constitute the second-conductivity-type regions of the second partial parallel pn layer, and portions of the third epitaxial layer excluding the diffusion regions constitute the first-conductivity-type regions of the second partial parallel pn layer.

In the embodiment, the second partial parallel pn layer has: a third epitaxial layer of a first conductivity type containing silicon carbide, a plurality of first diffusion regions, each containing an impurity of a second conductivity type, introduced in the third epitaxial layer, the second diffusion regions constituting the second-conductivity-type regions of the second partial parallel pn layer, and a plurality of second diffusion regions, each containing an impurity of the first conductivity type, introduced in the third epitaxial layer, an impurity concentration of the second diffusion regions being higher than that of the third epitaxial layer, the second diffusion regions constituting the first-conductivity-type regions of the second partial parallel pn layer.

In the embodiment, the third partial parallel pn layer includes a fourth epitaxial layer of a first conductivity type containing silicon carbide, a plurality of second trenches reaching the second partial parallel pn layer from a surface of the fourth epitaxial layer and terminating in the second partial parallel pn layer, and a fifth epitaxial layer of a second conductivity type, embedded in the second trenches. Portions of the fourth epitaxial layer between adjacent second trenches among the second trenches constitute the first-conductivity-type regions of the third partial parallel pn layer. The fifth epitaxial layer embedded in the second trenches constitutes the second-conductivity-type regions of the third partial parallel pn layer.

In the embodiment, the first-conductivity-type regions and the second-conductivity-type regions in each of the first, second and third partial parallel pn layers extend in a striped pattern parallel to the main surface, and are disposed to alternate one another along a direction orthogonal to a direction along which the striped pattern extends. A direction along which the striped pattern of the first-conductivity-type regions and the second-conductivity-type regions of the second partial parallel pn layer extends, and a direction along which the striped pattern of the first-conductivity-type regions and the second-conductivity-type regions of the first partial parallel pn layer extends, form an angle of at least 45 degrees.

In the embodiment, the direction along which the striped pattern of the first-conductivity-type regions and the second-conductivity-type regions of second partial parallel pn layer extends and the direction along which the striped pattern of the first-conductivity-type regions and the second-conductivity-type regions of the first partial parallel pn layer extends are orthogonal to each other.

In the embodiment, the second partial parallel pn layer has a periodic concentration distribution in the depth direction of the silicon carbide substrate.

In the embodiment, the method further includes repeatedly performing the third stacking process, to thereby stack at least one additional third partial parallel pn layer on said third partial parallel pn layer, to be an additional portion of the parallel pn layer.

Objects, features, and advantages of the present invention are specifically set forth in or will become apparent from the following detailed description of the invention when read in conjunction with the accompanying drawings.

DETAILED DESCRIPTION OF THE INVENTION

Figure 1:
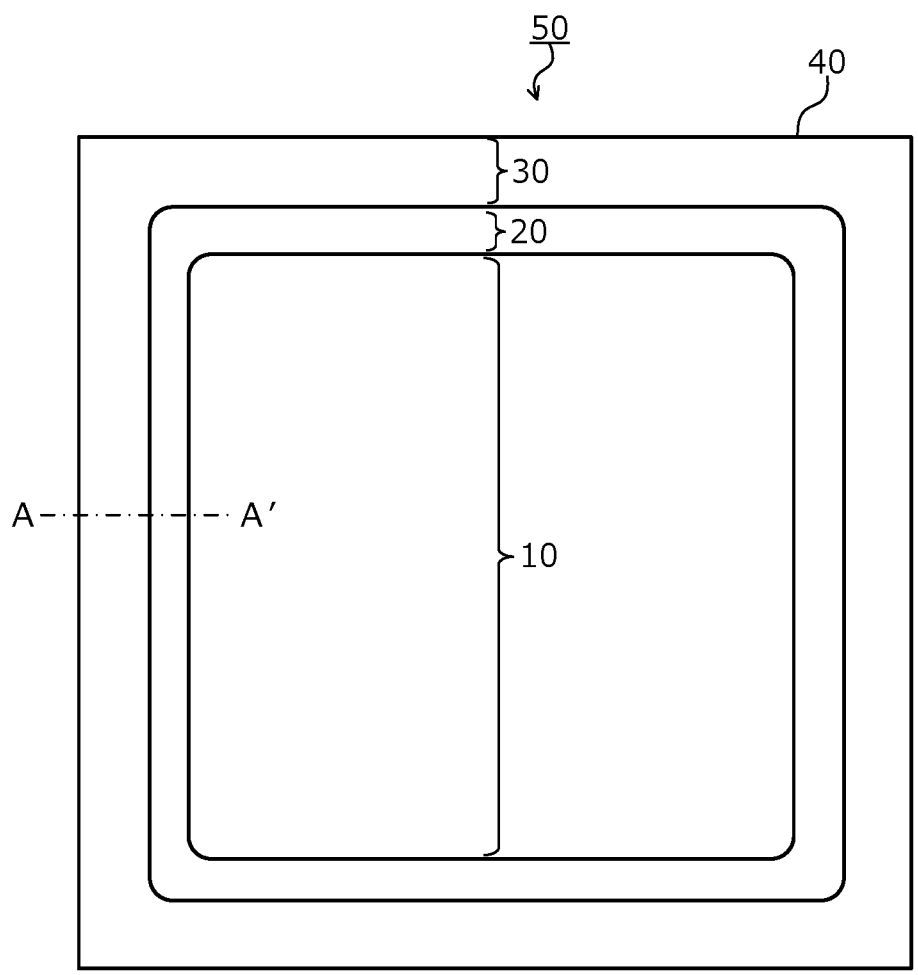
FIG. 1 is a plan view of a layout when a silicon carbide semiconductor device according to a first embodiment is viewed from a front side of a semiconductor substrate.

First, problems associated with the conventional techniques will be discussed. In a super junction semiconductor device, the higher is a breakdown voltage, the greater is an effect of reducing ON resistance is by the SJ structure, however, to increase the breakdown voltage, the thickness of the drift layer has to be increased. Nonetheless, when the thickness of the drift layer is increased, as described above, forming the drift layer have a full SJ structure is difficult. Further, when the drift layer is formed to have a partial SJ structure, the effect of reducing the ON resistance by the SJ structure decreases as compared to the full SJ structure. For example, in a 6.5 kV super junction semiconductor device, the thickness of the drift layer is about 65 μm and therefore, when the drift layer is formed to have a full SJ structure, in particular, the following problems occur.

When a drift layer having the thickness described above is formed to have a full SJ structure by using the multi-stage epitaxial process, a few dozen stages of epitaxial growth are necessary to increase the thickness of the epitaxial layer that forms the drift layer to a predetermined thickness. Even when the thickness for each stage of the epitaxial growth is increased to reduce the total number of stages and ion implantation equipment capable of realizing high acceleration energy of a few MeV is used to repeatedly perform each stage of epitaxial growth, formation of a full SJ structure using the multi-stage epitaxial process is not realistic.

On the other hand, when a drift layer having the thickness described above is formed to have a full SJ structure by using the trench embedding epitaxial process, trenches having a high aspect ratio have to be formed to a depth of about 60 μm and extremely difficult epitaxial growth has to be performed to completely embed the trenches with an epitaxial layer and therefore, forming the drift layer to have a full SJ structure is extremely difficult. Thus, to perform trench etching and epitaxial growth without any problems, inevitably the width of the trenches is increased.

When the width of the trenches is increased, the rate at which the trenches are embedded with the epitaxial layer decreases and a long period of time is necessary to form the SJ structure. Furthermore, when the width of the trenches is too wide, the epitaxial layer is only formed along inner walls of the trenches, whereby the trenches cannot be completely embedded with the epitaxial layer, further expanding the technological problem of embedding the epitaxial layer. Further, when the width of the trenches is increased, a repeat pitch of the n-type regions and the p-type regions of the parallel pn layer increases, whereby the effect of reducing the ON resistance by the SJ structure decreases.

Thus, in either case, whether the multi-stage epitaxial process is used or the trench embedding epitaxial process is used, formation of the SJ structure is difficult and characteristics as a super junction semiconductor device degrade.

Embodiments of a method of manufacturing a silicon carbide semiconductor device, a method of manufacturing a silicon carbide substrate, and a silicon carbide substrate according to the present invention will be described in detail with reference to the accompanying drawings. In the present description and accompanying drawings, layers and regions prefixed with n or p mean that majority carriers are electrons or holes. Additionally, + or − appended to n or p means that the impurity concentration is higher or lower, respectively, than layers and regions without + or −. In the description of the embodiments below and the accompanying drawings, main portions that are identical will be given the same reference numerals and will not be repeatedly described. Further, in the present description, when Miller indices are described, "−" means a bar added to an index immediately after the "−", and a negative index is expressed by prefixing "−" to the index.

Figure 2:
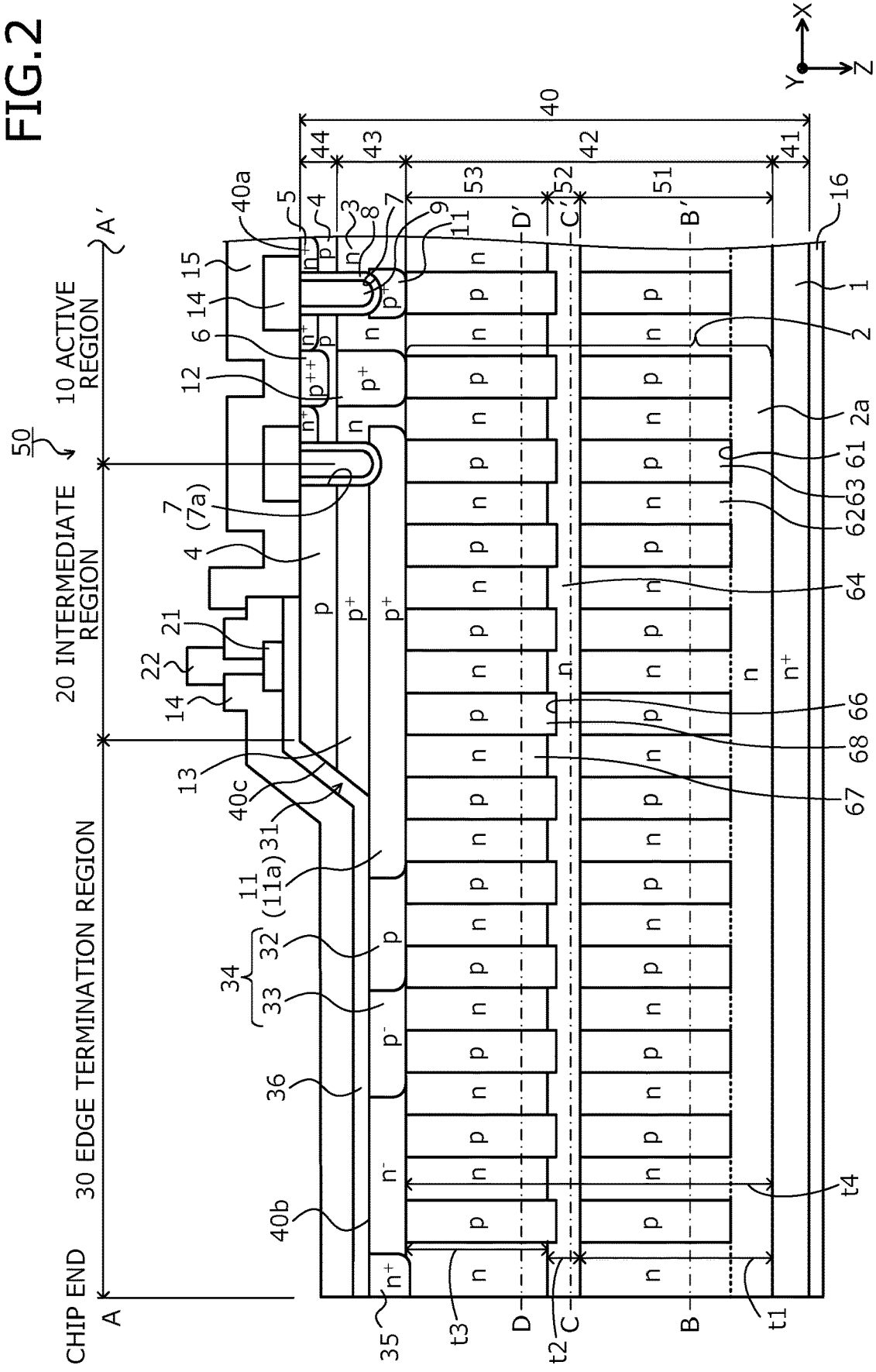
FIG. 2 is a cross-sectional view of a structure along cutting line A-A' in FIG. 1.

A structure of a silicon carbide semiconductor device according to a first embodiment will be described taking, as an example, a super junction MOSFET having a trench gate structure. FIG. 1 is a plan view of a layout when the silicon carbide semiconductor device according to the first embodiment is viewed from a front side of a semiconductor substrate. FIG. 2 is a cross-sectional view of the structure along cutting line A-A' in FIG. 1. FIG. 2 depicts an area from an outermost unit cell to a chip end (end of a semiconductor substrate (silicon carbide substrate) 40), the outermost unit cell being outermost (closest to the chip end) among unit cells (configuration units of an element) disposed in an active region 10.

Figure 3A:
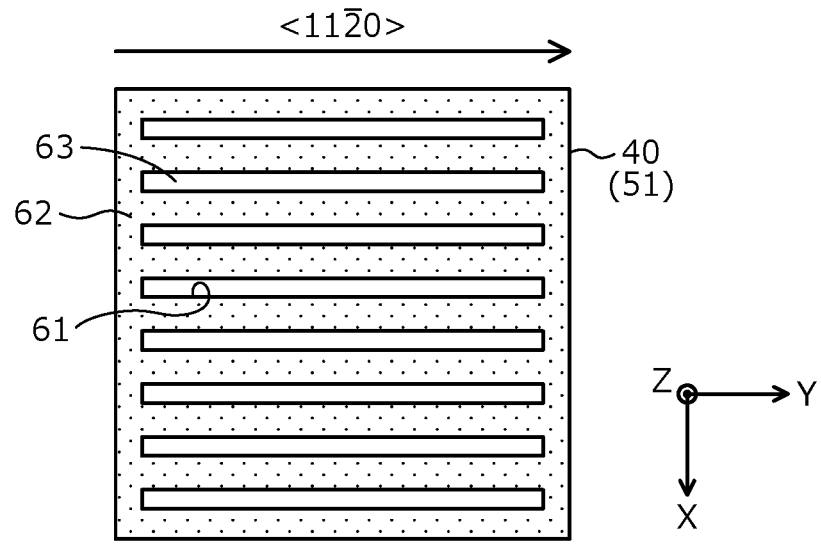
FIG. 3A is a plan view of an example of a layout when a drift layer having a super junction (SJ) structure depicted in FIG. 2 is viewed from the front side of the semiconductor substrate.
Figure 3B:
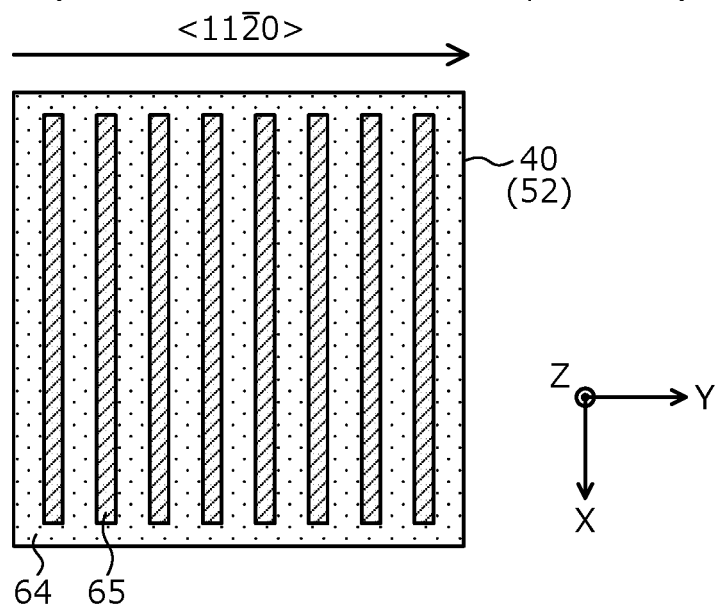
FIG. 3B is a plan view of an example of a layout when the drift layer having the SJ structure depicted in FIG. 2 is viewed from the front side of the semiconductor substrate.
Figure 3C:
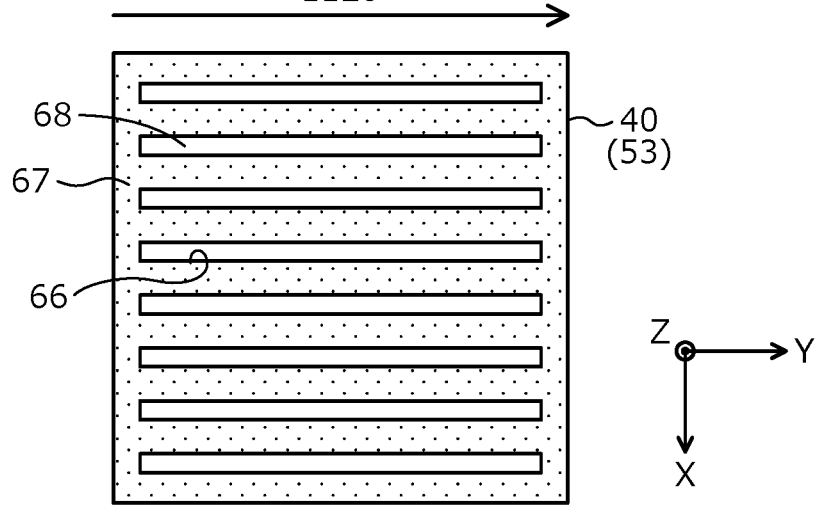
FIG. 3C is a plan view of an example of a layout when the drift layer having the SJ structure depicted in FIG. 2 is viewed from the front side of the semiconductor substrate.
Figure 4A:
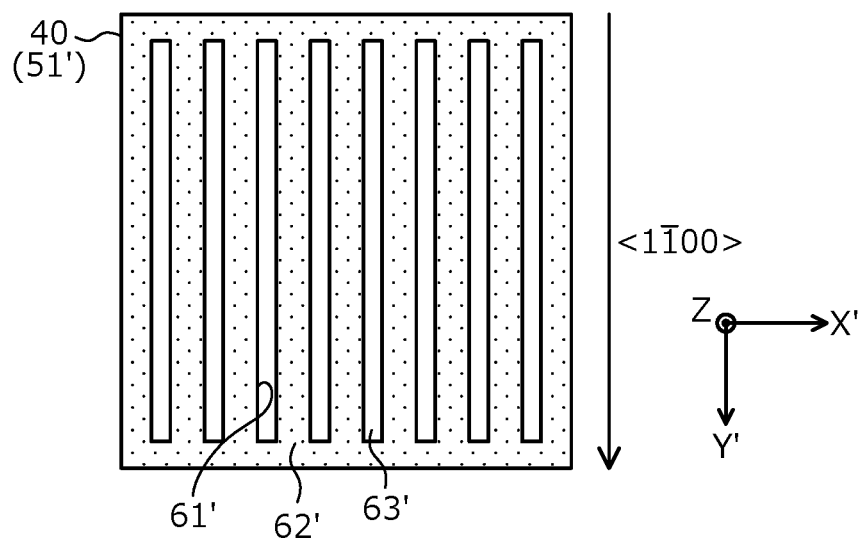
FIG. 4A is a plan view of an example of a layout when the drift layer having the SJ structure depicted in FIG. 2 is viewed from the front side of the semiconductor substrate.
Figure 4B:
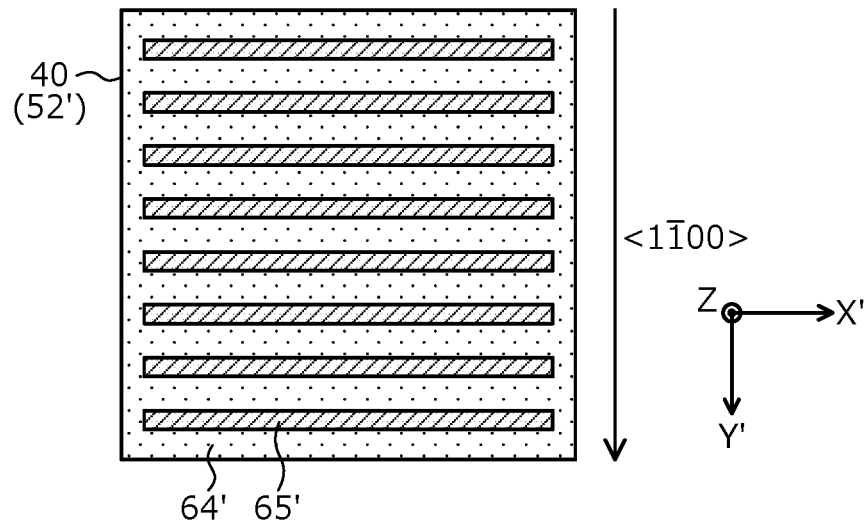
FIG. 4B is a plan view of an example of a layout when the drift layer having the SJ structure depicted in FIG. 2 is viewed from the front side of the semiconductor substrate.
Figure 4C:
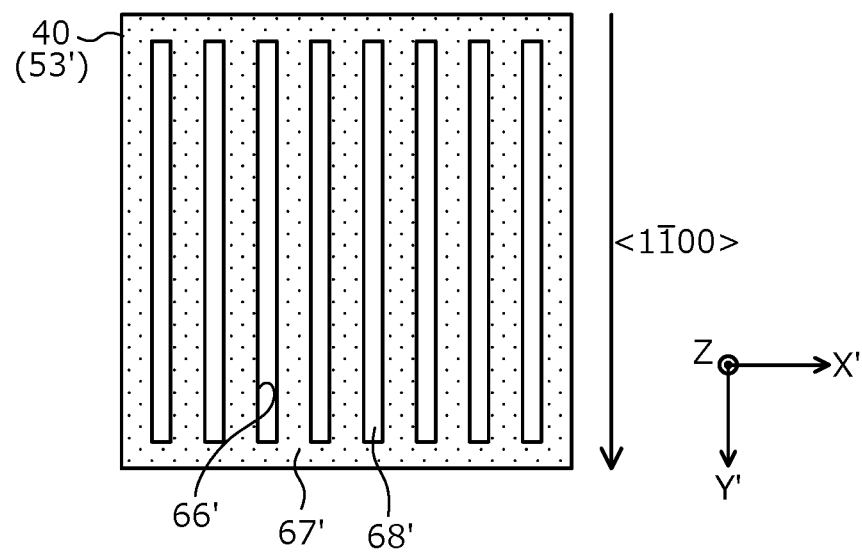
FIG. 4C is a plan view of an example of a layout when the drift layer having the SJ structure depicted in FIG. 2 is viewed from the front side of the semiconductor substrate.

FIGS. 3A, 3B, 3C, 4A, 4B, and 4C are plan views of examples of layouts when a drift layer 2 having the super junction (SJ) structure depicted in FIG. 2 is viewed from the front side of the semiconductor substrate. FIGS. 3A and 4A depict layouts of the SJ structure along cutting line B-B' in FIG. 2; FIGS. 3B and 4B depict layouts of the SJ structure along cutting line C-C' in FIG. 2; and FIGS. 3C and 4C depict layouts of the SJ structure along cutting line cutting line D-D' in FIG. 2. In FIGS. 3A, 3B, and 3C, for simplicity, fewer p-type regions (second-conductivity-type regions) 63, 65, 68 of first, second, and third partial parallel pn layers 51, 52, 53 are depicted as compared to FIG. 2, n-type regions (first-conductivity-type regions) 62, 64, 67 are indicated by dotted hatching, and p-type regions 65 are indicated by diagonal hatching (similarly in FIGS. 4A, 4B, and 4C).

A silicon carbide semiconductor device 50 according to the first embodiment depicted in FIG. 1 has a semiconductor substrate (semiconductor chip) 40 containing silicon carbide (SiC) and has therein the active region 10, an intermediate region 20, and an edge termination region 30, the silicon carbide semiconductor device 50 being a super junction MOSFET in which substantially an entire area of the drift layer 2 has a SJ structure (full SJ structure) in a depth direction Z, spanning the active region 10 and the edge termination region 30. The drift layer having a full SJ structure 2 means that in a front (upper) portion of the drift layer 2, a SJ structure is formed having a thickness t5 that is, for example, at least 80% of a total thickness t4 of the drift layer 2.

In the active region 10, a semiconductor element having a predetermined element structure is disposed. The active region 10 is a region through which a main current passes when the semiconductor element is in an ON state. The intermediate region 20 is a region that is between the active region 10 and the edge termination region 30, is adjacent to the active region 10, and surrounds a periphery of the active region 10. The edge termination region 30 is a region between the intermediate region 20 and ends of the semiconductor substrate 40, surrounds a periphery of the active region 10 with the intermediate region 20 intervening therebetween, mitigates electric field of a front (upper) portion of the semiconductor substrate 40 and sustains a breakdown voltage. The breakdown voltage is a voltage limit at which no erroneous operation or destruction of the semiconductor device occurs.

In the edge termination region 30, a voltage withstanding structure such as a junction termination extension (JTE) structure 34, a field limiting ring (FLR), a field plate (FP), etc. is disposed on the front side of the semiconductor substrate 40. Further, as one JTE structure, the voltage withstanding structure may have a spatial modulation structure in which p-type high-concentration impurity regions and p-type low-concentration impurity regions are alternately combined while widths thereof are changed. FIG. 2 depicts an instance in which in the edge termination region 30, the JTE structure 34 is disposed in the semiconductor substrate 40, at a front surface thereof.

In the active region 10, a general vertical MOSFET having a trench gate structure is disposed as the semiconductor element having a predetermined element structure. The trench gate structure is configured by p-type base regions 4, $n^+$-type source regions 5, $p^{++}$-type contact regions 6, gate trenches 7, gate insulating films 8, and gate electrodes 9 provided in an upper portion of the semiconductor substrate 40. The semiconductor substrate 40 is formed by an $n^+$-type starting substrate 41 containing silicon carbide and epitaxial layers 42, 43, 44 respectively forming the drift layer 2, n-type current spreading regions 3 and the p-type base regions 4, sequentially stacked on a front surface of the $n^+$-type starting substrate 41.

The semiconductor substrate 40 has a main surface that is a surface of the p-type epitaxial layer 44 and regarded as a front surface of the semiconductor substrate 40, and another main surface that is a back surface of the $n^+$-type starting substrate 41 and regarded as a back surface of the semiconductor substrate 40. Crystal plane orientation of the front surface of the semiconductor substrate 40 is, for example, a (0001) plane, a so-called Si face. The $n^+$-type starting substrate 41 is an $n^+$-type drain region 1. The gate trenches 7 penetrate the p-type epitaxial layer 44 from the front surface of the semiconductor substrate 40 in the depth direction Z to reach an $n^-$-type epitaxial layer 43 and, for example, extend in a striped pattern along a second direction Y described hereinafter.

Between adjacent gate trenches 7 among the gate trenches 7, for example, the p-type base regions 4, the $n^+$-type source regions 5, and the $p^{++}$-type contact regions 6 are each selectively provided so as to extend linearly in the second direction Y. The p-type base regions 4 extends from the active region 10 toward the chip ends to a step 31 described hereinafter. Between the front surface of the semiconductor substrate 40 and the p-type base regions 4, the $n^+$-type source regions 5 and the $p^{++}$-type contact regions 6 are provided in contact with the p-type base regions 4 and are exposed at the front surface of the semiconductor substrate 40.

The $n^+$-type source regions 5 face the gate electrodes 9, across the gate insulating films 8 at sidewalls of the gate trenches 7. The $p^{++}$-type contact regions 6 are disposed at positions further from the gate trenches 7 than are the $n^+$-type source regions 5. Portions of the p-type epitaxial layer 44 excluding the $n^+$-type source regions 5 and the $p^{++}$-type contact regions 6 are the p-type base regions 4. Between the back surface of the semiconductor substrate 40 and the p-type base regions 4, the epitaxial layer 42 that is the drift layer 2 having the full SJ structure is provided. Configuration of the drift layer 2 having the full SJ structure will be described hereinafter.

Between the drift layer 2 and the p-type base regions 4, the n-type current spreading regions 3 are provided in contact with the p-type base regions 4 and the drift layer 2. The n-type current spreading regions 3 form a so-called current spreading layer (CSL) that reduces carrier spreading resistance. The n-type current spreading regions 3 are disposed between adjacent gate trenches 7 among the gate trenches 7 to be in contact with the gate trenches 7. The n-type current spreading regions 3 reach positions deeper from the front surface of the semiconductor substrate 40 than are the gate trenches 7.

In the n-type current spreading regions 3, $p^+$-type regions 11, 12, 13 are each selectively provided. The $p^+$-type regions 11 face bottoms of the gate trenches 7 along the depth direction Z, respectively. The p$^+$-type regions 11 are disposed at a depth deeper from the front surface of the semiconductor substrate 40 than are interfaces between the p-type base regions 4 and the n-type current spreading regions 3, separate from the p-type base regions 4. The p$^+$-type regions 11 may reach positions closer to the n$^+$-type drain region 1 than are the p$^+$-type regions 12. Of the p$^+$-type regions 11, a p$^+$-type region 11 that is closest to a chip end (hereinafter, outermost p$^+$-type region 11a) extends closer to the chip end than is the step 31 described hereinafter.

Between adjacent gate trenches 7 of the gate trenches 7, the p$^+$-type regions 12 are disposed separate from the p$^+$-type regions 11 and the gate trenches. The p$^+$-type regions 12 are in contact with the p-type base regions 4. The p$^+$-type region 13 is disposed between the outermost p$^+$-type region 11a and a p-type base region 4 and is in contact with the outermost p$^+$-type region 11a and the p-type base regions 4 in the depth direction Z. The p$^+$-type region 13 extends from an outermost gate trench 7a to the step 31, the outermost gate trench 7a being closest to a chip end, of the gate trenches 7a. The p$^+$-type regions 11, 12 have a function of mitigating electric field concentration at the gate insulating films 8 at the bottoms of the gate trenches 7.

In an entire area of the front surface of the semiconductor substrate 40, an interlayer insulating film 14 is provided so as to cover the gate electrodes 9. A source electrode 15 is in ohmic contact with and electrically connected to the n$^+$-type source regions 5 and the p$^{++}$-type contact regions 6 through contact holes formed in the interlayer insulating film 14. The source electrode 15 extends from the active region 10 toward the chip ends and is electrically connected to the p-type base regions 4 in the intermediate region 20.

The source electrode 15 extends from the active region 10 to the intermediate region 20 and terminates closer to the active region 10 (chip center) than is later-described gate metal wiring 22 in the intermediate region 20. A barrier metal (not depicted) may be provided between the source electrode 15 and the interlayer insulating film 14. The barrier metal has a function of preventing atomic diffusion and reactions between the regions sandwiching the barrier metal. A passivation film (not depicted) covers an entire area of the front surface of the semiconductor substrate 40. A portion of the source electrode 15 exposed by an opening in the passivation film forms a source pad.

The intermediate region 20 is a region that is closer to chip ends than is a center of each outermost gate trench 7a in a first direction X that is parallel to the front surface of the semiconductor substrate 40, the region being from a portion closer to chip ends than are ends of the n$^+$-type source regions 5 to the step 31 in the second direction Y parallel to the front surface of the semiconductor substrate 40 and orthogonal to the first direction X. In a portion of the intermediate region 20 closer to a chip end than is the source electrode 15, an insulating layer in which a field oxide film 36 and the interlayer insulating film 14 are sequentially stacked extends on a first face 40a described hereinafter of the front surface of the semiconductor substrate 40, from the edge termination region 30.

In the intermediate region 20, a gate runner 21 and the gate metal wiring 22 are disposed. The gate runner 21 is provided on the first face 40a of the front surface of the semiconductor substrate 40 via the field oxide film 36, is connected to the gate electrodes 9 and a gate pad (not depicted) at a non-depicted portion, and electrically connects the gate electrodes 9 and the gate pad. The gate runner 21 is covered by the interlayer insulating film 14. The gate metal wiring 22 is electrically connected to the gate runner 21 through a contact hole formed in the interlayer insulating film 14.

In the edge termination region 30, for example, spanning an entire area of the edge termination region 30, the p-type epitaxial layer 44 is removed, whereby a portion of the front surface of the semiconductor substrate 40 in the edge termination region 30 is made lower than a portion thereof (hereinafter, the first face 40a) closer to the active region 10 (is recessed), thereby forming the step 31. Formation of the step 31 exposes the n$^-$-type epitaxial layer 43 at a portion (hereinafter, second face) 40b of the front surface of the semiconductor substrate 40 closer to the chip ends than is the step 31.

At the second face 40b of the front surface of the semiconductor substrate 40, in a portion of the second face 40b closer to the active region 10 than to a chip end, the outermost p$^+$-type region 11a is exposed. At a portion (mesa edge of the step 31: hereinafter, third face) 40c of the front surface of the semiconductor substrate 40 between the first face 40a and the second face 40b, the p-type base regions 4 and the p$^+$-type region 13 are exposed. Exposed at the second and third faces 40b, 40c of the front surface of the semiconductor substrate 4 means being disposed in surface regions of the second and third faces 40b, 40c of the front surface of the semiconductor substrate 40, in contact with the field oxide film 36 on the second and the third faces 40b, 40c.

Further, in a surface region of the second face 40b of the front surface of the semiconductor substrate 40, the JTE structure 34 is provided closer to the chip ends than is the outermost p$^+$-type region 11a. The JTE structure 34 is a voltage withstanding structure in which multiple p-type regions (Here, 2. Hereinafter, first and second JTE regions 32, 33 sequentially from nearest the active region 10) each having an impurity concentration lower than an impurity concentration of the outermost p$^+$-type region 11a are disposed adjacent to one another, in descending order of impurity concentration with increasing proximity to the chip ends. The first and the second JTE regions 32, 33, for example, penetrate the n$^-$-type epitaxial layer 43 in the depth direction Z and reach the epitaxial layer 42.

The first JTE region 32 is adjacent to the outermost p$^+$-type region 11a on a side thereof facing a chip end. The second JTE region 33 is adjacent to the first JTE region 32 on a side thereof facing the chip end. A predetermined breakdown voltage of the edge termination region 30 is sustained by pn junctions between the first and the second JTE regions 32, 33 and n-type regions of an uppermost partial parallel pn layer described hereinafter (n-type regions 67 of a third partial parallel pn layer 53). Further, in surface regions of the second face 40b of the front surface of the semiconductor substrate 40, n$^+$-type stopper regions 35 are selectively provided separate from the JTE structure 34 and so as to be exposed at the ends of the semiconductor substrate 40.

While not depicted, between the adjacent first and the second JTE regions 32, 33 of the JTE structure 34, a region (hereinafter, spatial modulation region) may be provided in which a p-type region having an impurity concentration equal to that of the first JTE region 32 and a p-type region having an impurity concentration equal to that of the second JTE region 33 are disposed adjacent to and repeatedly alternating one another in concentric circles surrounding a periphery of the active region 10. For example, in an instance of a breakdown voltage of at least 1.7 kV, the spatial modulation region may be provided in the JTE structure 34.

At a portion of the second face 40b of the front surface of the semiconductor substrate 40 excluding the JTE structure 34 and the n+-type stopper regions 35, the n−-type epitaxial layer 43 is exposed. The second and the third faces 40b, 40c of the front surface of the semiconductor substrate 40 are covered by an insulating layer in which the field oxide film 36 and the interlayer insulating film 14 are sequentially stacked. The field oxide film 36 extends on the first face 40a of the front surface of the semiconductor substrate 40 in the intermediate region 20. In an entire area of the back surface of the semiconductor substrate 40 (back surface of the n+-type starting substrate 41), a drain electrode 16 is provided.

Next, a configuration of the drift layer 2 having the full SJ structure (the epitaxial layer 42) will be described. The drift layer having the full SJ structure 2 has a configuration in which on the front surface of the n+-type starting substrate 41, at least three parallel pn layers (hereinafter, partial parallel pn layers) are continuously stacked so that the total thickness t4 of the drift layer 2 is obtained. Each of the partial parallel pn layers is disposed from the active region 10 to chip end continuously in the same pattern for the partial parallel pn layer.

Each of the partial parallel pn layers configuring the drift layer 2 has the full SJ structure formed by a trench embedding epitaxial process or the full SJ structure formed using a multi-stage epitaxial process. The full SJ structure is a structure in which a SJ structure having n-type regions and p-type regions disposed adjacent to and repeatedly alternating one another in a direction parallel to the front surface of the semiconductor substrate 40 extends spanning substantially an entire area of the total thickness t4 of the drift layer 2 in the depth direction Z.

The partial parallel pn layers formed by the trench embedding epitaxial process (hereinafter, embedded-trench parallel pn layer) are formed by forming in an n-type epitaxial layer having a thick thickness formed by one stage (one session) of epitaxial growth, trenches (hereinafter, SJ trenches) that penetrate the n-type epitaxial layer in the depth direction Z, and embedding a p-type epitaxial layer in the SJ trenches.

The partial parallel pn layers formed using the multi-stage epitaxial process (hereinafter, multi-stage epi parallel pn layers) are formed by selectively forming in an n-type epitaxial layer having a thin thickness formed by one stage of epitaxial growth, p-type regions that penetrate the n-type epitaxial layer in the depth direction Z by an ion implantation for forming the p-type regions. In the multi-stage epi parallel pn layers, crystal defects are introduced by the ion implantation.

The drift layer 2 having the full SJ structure is configured by at least three layers (in FIG. 2, three layers: hereinafter, the first to the third partial parallel pn layers 51 to 53) of the embedded-trench parallel pn layer and the multi-stage epi parallel pn layer stacked repeatedly alternating one another. Between adjacent embedded-trench parallel pn layers (partial parallel pn layers) in the depth direction Z, a multi-stage epi parallel pn layer (partial parallel pn layer) is disposed adjacent to the embedded-trench parallel pn layers. The partial parallel pn layers that are uppermost and lowermost are both embedded-trench parallel pn layers.

The multi-stage epi parallel pn layer is included in a portion of the drift layer 2, whereby minority carrier (hole) lifetime of the drift layer 2 becomes shorter compared to an instance in which the drift layer 2 is configured by only an embedded-trench parallel pn layer that lacks crystal defects or an instance in which silicon (Si) without introduced crystal defects is used as a semiconductor material. As a result, a parasitic diode (body diode) formed by pn junctions between the p++-type contact regions 6, the p-type base regions 4 and the p+-type regions 11 and the n-type current spreading regions 3, n-type regions of the partial parallel pn layers, an n-type drift region 2a and the n+-type drain region 1 has a soft recovery, and noise during reverse recovery of the parasitic diode may be reduced.

The n-type regions and the p-type regions of the partial parallel pn layers are disposed in striped patterns extending in a direction parallel to the front surface of the semiconductor substrate 40. The striped pattern of the n-type regions and the p-type regions of the embedded-trench parallel pn layer and the striped pattern of the n-type regions and the p-type regions of the multi-stage epi parallel pn layer extend in different directions so that when viewed from the front side of the semiconductor substrate 40, the striped patterns are not parallel but rather, for example, intersect at an angle of at least 45 degrees or may be orthogonal. As a result, even when positions of the n-type regions and the p-type regions deviate, the n-type regions and the p-type regions of one of the embedded-trench parallel pn layers and the n-type regions and the p-type regions of the adjacent embedded-trench parallel pn layer may be connected respectively in the depth direction Z via the n-type regions and the p-type regions of the multi-stage epi parallel pn layer, respectively.

In the embedded-trench parallel pn layers and the multi-stage epi parallel pn layer, widths of the n-type regions and of the p-type regions adjacent to one another in a direction parallel to the front surface of the semiconductor substrate 40 are equal and substantially in charge balance. The n-type regions and the p-type regions of the multi-stage epi parallel pn layer have impurity concentrations substantially equal to the impurity concentrations of the n-type regions and the p-type regions of the embedded-trench parallel pn layers, respectively. Substantially equal impurity concentrations mean equal impurity concentrations in a range that includes error allowed for process variation. Interfaces between the embedded-trench parallel pn layers and the multi-stage epi parallel pn layer are flat surfaces substantially parallel to the front surface of the semiconductor substrate 40.

The embedded-trench parallel pn layers have a thickness that is sufficiently thick compared to the multi-stage epi parallel pn layer and the embedded-trench parallel pn layers occupy a majority of the drift layer 2. The drift layer 2 having the full SJ structure satisfies the conditions described above and suffices to have an odd number of stacked partial parallel pn layers of at least three layers, where the greater is the number of partial parallel pn layers, the greater is the number of stages of the embedded-trench parallel pn layers configuring the drift layer 2. The greater is the number of stages of the embedded-trench parallel pn layers, the thinner the thickness of each of the embedded-trench parallel pn layers may be to obtain the total thickness t4 of the drift layer 2.

The thinner is the thickness of each of the embedded-trench parallel pn layers, the shallower the depth of the SJ trenches may be. Therefore, trench etching for forming the SJ trenches in the embedded-trench parallel pn layers and embedding of the epitaxial layer in the SJ trenches are facilitated. Accordingly, even when the width of the SJ trenches is reduced, the depth of the SJ trenches may be reduced, thereby avoiding the process problems described above in an instance where silicon carbide is used as a semiconductor material and enabling formation of the full SJ structure.

Hereinafter, when the drift layer 2 having the full SJ structure is configured by three partial parallel pn layers, the drift layer 2 having the full SJ structure has first-layer and third-layer embedded-trench parallel pn layers (first and third partial parallel pn layers 51, 53), and a second-layer multi-stage epi parallel pn layer (second partial parallel pn layer 52) disposed between the embedded-trench parallel pn layers.

The first partial parallel pn layer 51 is an embedded-trench parallel pn layer. The first partial parallel pn layer 51 is formed by the n-type regions 62 and the p-type regions 63 disposed adjacent to and repeatedly alternating one another along the first direction X. The n-type regions 62 and the p-type regions 63 extend in a linear shape along a <11-20> direction of the silicon carbide, parallel to the second direction Y (FIG. 3A). Therefore, pn junction surfaces between the p-type regions 63 and the n-type regions 62 are epitaxial layers having favorable crystallinity and a substantially flat surface parallel to a {1-100} plane initially grown, and the pn junction surfaces are substantially orthogonal to the front surface of the semiconductor substrate 40.

The first partial parallel pn layer 51 has SJ trenches (first trenches) 61 that penetrate an n-type epitaxial layer configuring the first partial parallel pn layer 51. The SJ trenches 61 have an aspect ratio (=depth of SJ trench 61/width of SJ trench 61) that is, for example, in a range from 5 to 15. The n-type regions 62 are portions of the n-type epitaxial layer configuring the first partial parallel pn layer 51 left after formation of the SJ trenches 61. The p-type regions 63 are a p-type epitaxial layer embedded in the SJ trenches 61.

In the first partial parallel pn layer 51, the n-type regions 62 are further disposed along the chip ends in an outermost portion of the semiconductor substrate 40. In a plan view thereof from the front side of the semiconductor substrate 40, a ring-shaped portion along chip ends having the n-type regions 62 surrounds a periphery of a center portion of the semiconductor substrate 40 and connects all of the n-type regions 62 that have the linear shape. The n-type regions 62 and the p-type regions 63 have equal widths and are nearly charge balanced. The narrower are the widths and repeat pitch of the n-type regions 62 and the p-type regions 63, the greater is an effect of reducing the ON resistance. A portion of the first partial parallel pn layer 51 closest to the drain electrode 16 may be a normal n-type drift region 2a without the SJ structure.

The second partial parallel pn layer 52 is a multi-stage epi parallel pn layer adjacent to an upper side of the first partial parallel pn layer 51. The second partial parallel pn layer 52 is formed by the n-type regions 64 and the p-type regions 65 disposed adjacent to and repeatedly alternating one another along the second direction Y. The n-type regions 64 and the p-type regions 65 extend in a linear shape along the first direction X. When viewed from the front surface of the semiconductor substrate 40, the striped pattern of the n-type regions 64 and the p-type regions 65 is orthogonal to the striped pattern of the n-type regions 62 and the p-type regions 63 of the first partial parallel pn layer 51 (FIG. 3B).

The n-type regions 64 are portions of an n-type epitaxial layer configuring the second partial parallel pn layer 52 left after formation of the p-type regions 65. The p-type regions 65 are ion-implanted regions (diffused regions) selectively formed in the n-type epitaxial layer constituting the second partial parallel pn layer 52; the p-type regions 65 penetrate the n-type epitaxial layer in the depth direction Z and reach the first partial parallel pn layer 51. The n-type regions 64 and the p-type regions 65 have impurity concentrations that are equal to the impurity concentrations of the n-type regions 62 and the p-type regions 63 of the first partial parallel pn layer 51, respectively, and are in contact with each of the n-type regions 62 and the p-type regions 63.

As described above, when viewed from the front side of the semiconductor substrate 40, the striped pattern of the n-type regions 62 and the p-type regions 63 of the first partial parallel pn layer 51 and the striped pattern of the n-type regions 64 and the p-type regions 65 of the second partial parallel pn layer 52 are not parallel to one another. Therefore, at an interface between the first partial parallel pn layer 51 and the second partial parallel pn layer 52, each of the n-type regions 62 and the p-type regions 63 of the first partial parallel pn layer 51 may assuredly be in contact with the n-type regions 64 and the p-type regions 65 of the second partial parallel pn layer 52.

The second partial parallel pn layer 52 has a thickness that is thinner than that of the embedded-trench parallel pn layer and is, for example, about 0.65 µm±0.05 µm. The second partial parallel pn layer 52 has the thickness described, whereby when the third partial parallel pn layer 53 is formed on the second partial parallel pn layer 52, SJ trenches (second trenches) 66 of the third partial parallel pn layer 53 may be prevented from penetrating the second partial parallel pn layer 52 in the depth direction Z and reaching the first partial parallel pn layer 51. When the SJ trenches 66 of the third partial parallel pn layer 53 reach the first partial parallel pn layer 51, the n-type regions 64 and the p-type regions 65 of the second partial parallel pn layer 52 become charge unbalanced, which is undesirable.

Further, the second partial parallel pn layer 52 has the thickness described above, whereby an impurity ion-implanted using a general ion implanting device can be ion-implanted from one surface of the epitaxial layer configuring the second partial parallel pn layer 52 and reach the other surface thereof. In addition, the diffused regions formed by the ion implantation (here, the p-type regions 65) may be formed at a depth to penetrate through the epitaxial layer in the depth direction Z and to have a uniform doping concentration in the depth direction Z. A uniform impurity concentration means substantially the same impurity concentration in a range that includes error allowed for process variation.

Further, in the second partial parallel pn layer 52, in an outermost portion of the semiconductor substrate 40, the n-type regions 64 are further disposed along the chip ends. In a plan view thereof from the front side of the semiconductor substrate 40, a ring-shaped portion along the chip ends having the n-type regions 64 surrounds a periphery of a center portion of the semiconductor substrate 40, connects all of the n-type regions 64 that have the linear shape, and in the depth direction Z, is in contact with the ring-shape portion of the n-type regions 62 along the chip ends in the first partial parallel pn layer 51 in a plan view thereof from the front side of the semiconductor substrate 40. The n-type regions 64 and the p-type regions 65 have equal widths and are nearly charge balanced. The narrower are the widths and repeat pitch of the n-type regions 64 and the p-type regions 65, the greater is the effect of reducing the ON resistance.

The third partial parallel pn layer 53 is an embedded-trench parallel pn layer adjacent to an upper side of the second partial parallel pn layer 52. The third partial parallel pn layer 53 is formed by the n-type regions 67 and the p-type regions 68 disposed adjacent to and repeated alternating one another along the first direction X, in a layout similar to that of the n-type regions 62 and the p-type regions 63 of the first partial parallel pn layer 51. Therefore, the striped pattern of the n-type regions 67 and the p-type regions 68 is orthogonal to the striped pattern of the n-type regions 64 and the p-type regions 65 of the second partial parallel pn layer 52 (FIG. 3C).

The third partial parallel pn layer 53 has the SJ trenches 66 that penetrate an n-type epitaxial layer configuring the third partial parallel pn layer 53. Bottoms of the SJ trenches 66 reach positions closer to the drain electrode 16 than is an interface between the third partial parallel pn layer 53 and the second partial parallel pn layer 52, and terminate in the second partial parallel pn layer 52. The SJ trenches 66 may face the SJ trenches 61 of the first partial parallel pn layer 51. The SJ trenches 66 have an aspect ratio (=depth of SJ trench 66/width of SJ trench 66) in a range, for example, from 5 to 15.

The n-type regions 67 are portions of the n-type epitaxial layer configuring the third partial parallel pn layer 53 left after formation of the SJ trenches 66. The n-type regions 67 are in contact with the n-type regions 64 of the second partial parallel pn layer 52 and are connected to the n-type regions 62 of the first partial parallel pn layer 51 through the n-type regions 64. The p-type regions 68 are a p-type epitaxial layer embedded in the SJ trenches 66. The p-type regions 68 are in contact with the p-type regions 65 of the second partial parallel pn layer 52 and are connected to the p-type regions 63 of the first partial parallel pn layer 51 through the p-type regions 65.

As described above, when viewed from the front side of the semiconductor substrate 40, the striped pattern of the n-type regions 64 and the p-type regions 65 of the second partial parallel pn layer 52 and the striped pattern of the n-type regions 67 and the p-type regions 68 of the third partial parallel pn layer 53 are not parallel to one another. Therefore, at an interface between the second partial parallel pn layer 52 and the third partial parallel pn layer 53, each of the n-type regions 64 and the p-type regions 65 of the second partial parallel pn layer 52 may assuredly be in contact with the n-type regions 67 and the p-type regions 68 of the third partial parallel pn layer 53.

Further, as described above, bottoms of the SJ trenches 66 terminate in the second partial parallel pn layer 52, thereby enabling the p-type regions 68 and the p-type regions 65 of the second partial parallel pn layer 52 to assuredly contact one another. The n-type regions 67 and the p-type regions 68 have impurity concentrations equal to the impurity concentrations of the n-type regions 62 and the p-type regions 63 of the first partial parallel pn layer 51, respectively. The n-type regions 67 and the p-type regions 68 have equal widths and are nearly charge balanced. The narrower are the widths and repeat pitch of the n-type regions 67 and the p-type regions 68, the greater is the effect of reducing the ON resistance.

In this manner, through the n-type regions 64 of the second partial parallel pn layer 52, the n-type regions 62 of the first partial parallel pn layer 51 and the n-type regions 67 of the third partial parallel pn layer 53 are connected to one another in the depth direction Z. Through the p-type regions 65 of the second partial parallel pn layer 52, the p-type regions 63 of the first partial parallel pn layer 51 and the p-type regions 68 of the third partial parallel pn layer 53 are connected to one another in the depth direction Z. The first to the third partial parallel pn layers 51 to 53 are sequentially stacked to thereby configure the drift layer 2 having the full SJ structure.

Further, as described above, the embedded-trench parallel pn layers and the multi-stage epi parallel pn layer suffice to be disposed so that the respective striped patterns of the n-type regions and the p-type regions are not parallel to one another and a layout thereof in a plan view of the n-type regions and the p-type regions of the first to the third partial parallel pn layers from the front side of the semiconductor substrate 40 may be variously changed. To form the embedded-trench parallel pn layer, the epitaxial growth rate of the p-type epitaxial layer in the SJ trenches varies depending on the nature of the crystal plane orientation of the sidewalls of the SJ trenches.

For example, as depicted in FIGS. 4A, 4B, and 4C, n-type regions 62', 67' and p-type regions 63', 68' of first and third partial parallel pn layers 51', 53' have a striped pattern extending in a <1-100> direction of silicon carbide, parallel to a second direction Y'. N-type regions 64' and p-type regions 65' of the second partial parallel pn layer 52' have a striped pattern extending parallel to a first direction X'. Layouts of the n-type regions 67' and the p-type regions 68' of the third partial parallel pn layer 53' are similar to those of the n-type regions 62' and the p-type regions 63' of the first partial parallel pn layer 51', respectively.

In the first and the third partial parallel pn layers 51', 53', pn junction surfaces between the p-type regions 63', 68' and the n-type regions 62', 67' have a predetermined incline with respect to sidewalls of the SJ trenches 61', 66', based on the nature of a {11-20} plane forming the sidewalls of the SJ trenches 61', 66' and occurring when the p-type epitaxial layer that forms the p-type regions 63', 68' is embedded in the SJ trenches 61', 66'. When the first, second, and third partial parallel pn layers 51', 52', 53' depicted in FIGS. 4A, 4B, and 4C constitute the drift layer 2, a cross-sectional view thereof is the cross-sectional view depicted in FIG. 2 where the first and the second directions X, Y are assumed as the first and the second directions X', Y'.

Figure 5:
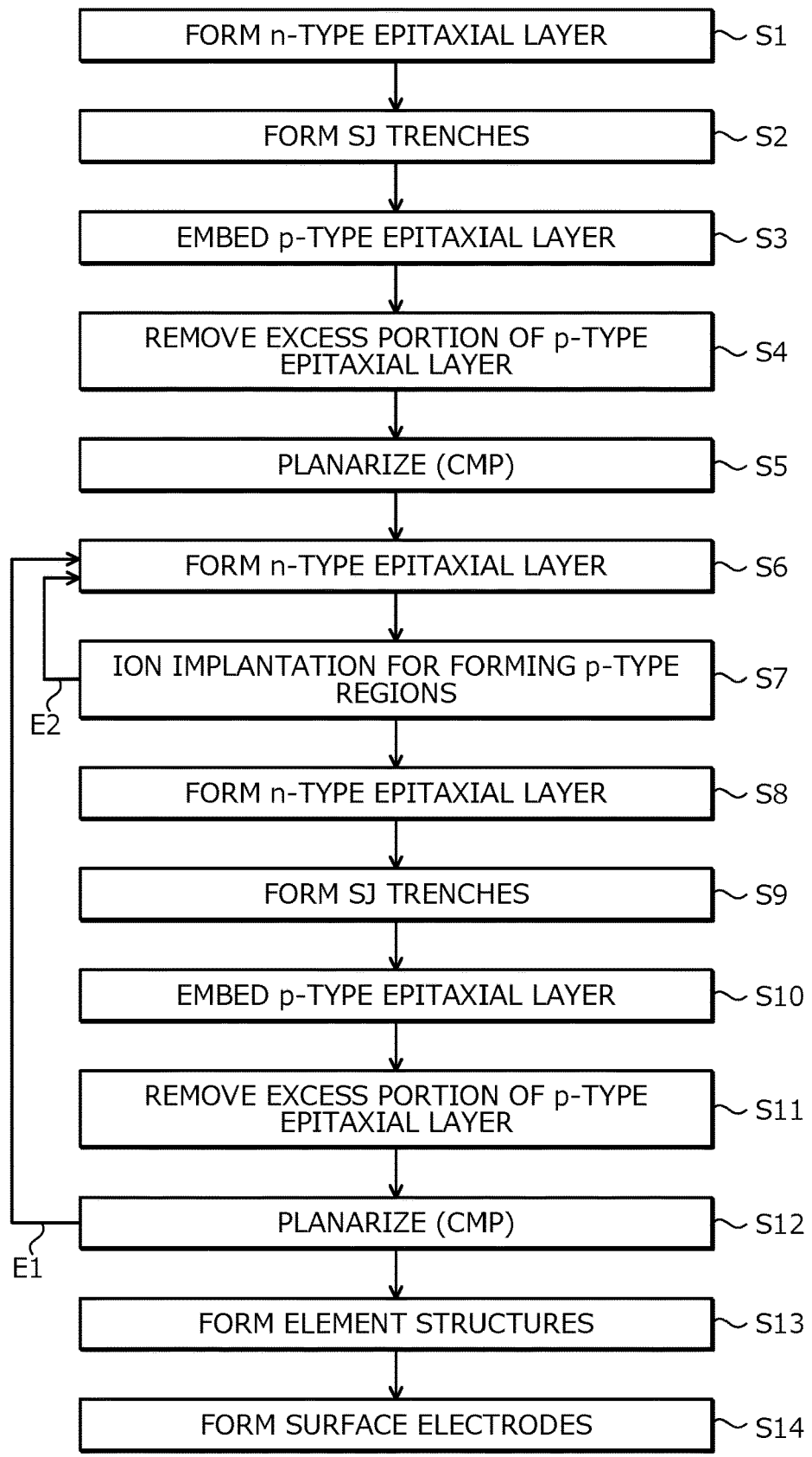
FIG. 5 is a flowchart of an outline of a method of manufacturing the silicon carbide semiconductor device according to the first embodiment.
Figure 9:
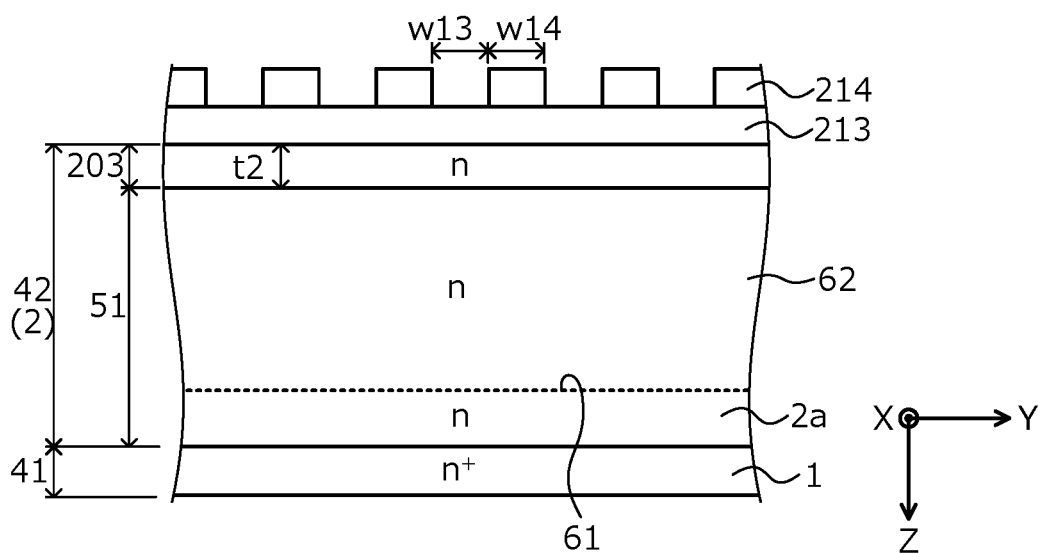
FIG. 9 is a cross-sectional view of a state of the silicon carbide semiconductor device according to the first embodiment during manufacture.
Figure 10:
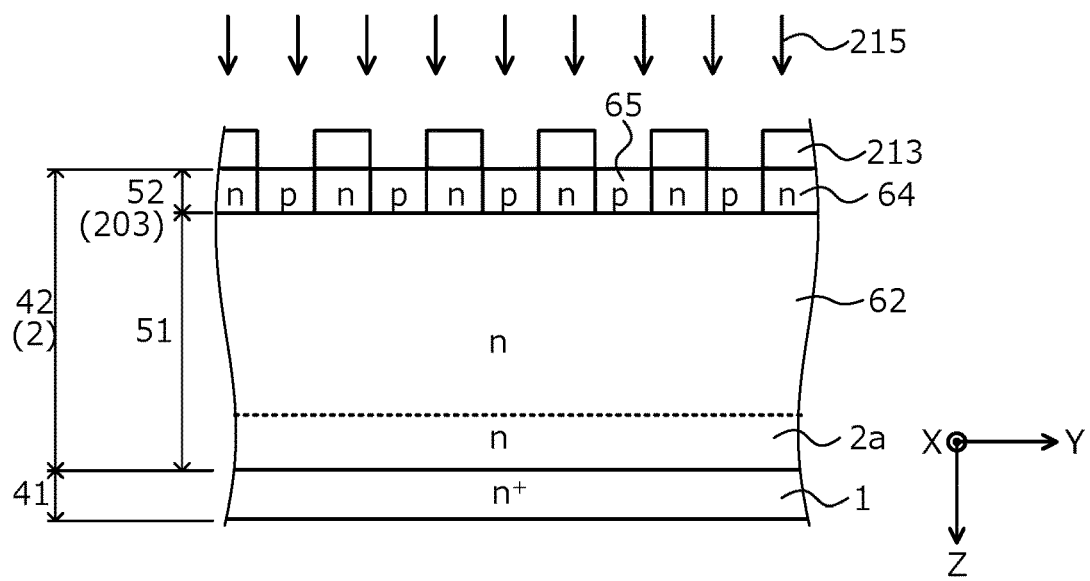
FIG. 10 is a cross-sectional view of a state of the silicon carbide semiconductor device according to the first embodiment during manufacture.

Next, a method of manufacturing the silicon carbide semiconductor device 50 according to the first embodiment will be described. FIG. 5 is a flowchart of an outline of the method of manufacturing the silicon carbide semiconductor device according to the first embodiment. FIGS. 6, 7, 8, 9, 10, 11, 12, 13, 14, 15, and 16 are cross-sectional views of states of the silicon carbide semiconductor device according to the first embodiment during manufacture. FIGS. 6 to 8, 11 to 16 are cross-sectional views of the active region 10 (refer to FIG. 2) orthogonal to the second direction Y and FIGS. 9 and 10 are cross-sectional views of the active region 10 orthogonal to the first direction X.

First, both surfaces of the $n^+$-type starting substrate (semiconductor wafer) 41 are subject to chemical mechanical polishing (CMP) and then, for example, the $n^+$-type starting substrate 41 is cleaned by organic cleaning and RCA cleaning, etc. The $n^+$-type starting substrate 41, for example, may a crystal structure that is a 4-layer periodic hexagonal crystal structure of silicon carbide (4H-SiC) and the front surface thereof may be a (0001) plane, a so-called Si-face. The $n^+$-type starting substrate 41 forms the $n^+$-type drain region 1.

Figure 6:
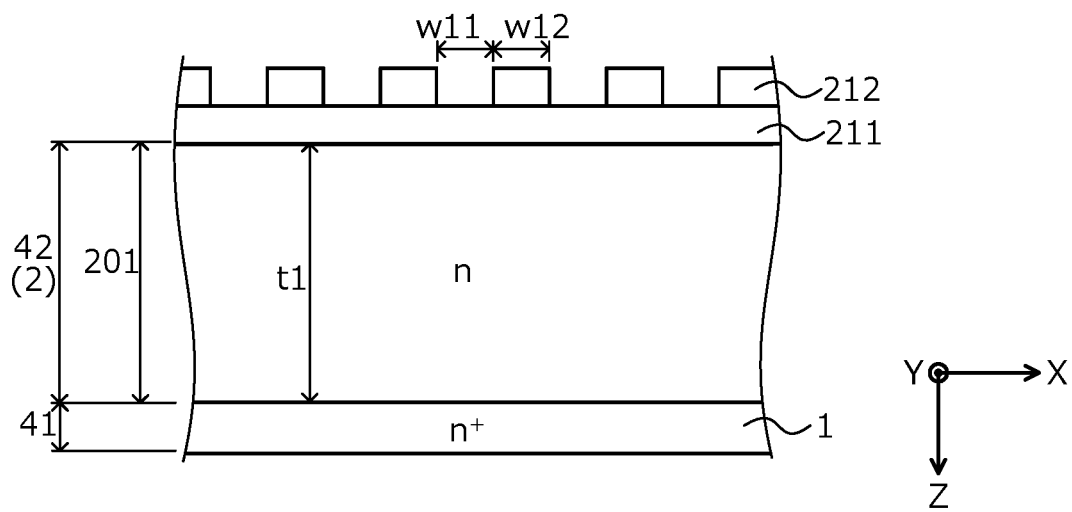
FIG. 6 is a cross-sectional view of a state of the silicon carbide semiconductor device according to the first embodiment during manufacture.

Next, as depicted in FIG. 6, an n-type epitaxial layer (first epitaxial layer) 201 is epitaxial grown (formed) on the front surface of the $n^+$-type starting substrate 41 as a portion of the epitaxial layer 42 (the drift layer 2), using a chemical vapor deposition (CVD) apparatus (step S1: first process). The n-type epitaxial layer 201 has a thickness t1 and an impurity concentration that are, for example, about 40 μm and about $1 \times 10^{16}/cm^3$, respectively.

Next, the resulting epitaxial substrate in which the n-type epitaxial layer 201 is stacked on the $n^+$-type starting substrate 41, for example, is cleaned by organic cleaning and RCA cleaning, etc. Next, for example, an oxide ($SiO_2$) film 211 having a thickness of, for example, about 6 μm is formed on the surface of the n-type epitaxial layer 201, using a plasma CVD (PCVD) apparatus.

Next, by photolithography, a resist film 212 having openings at portions corresponding to formation regions of the SJ trenches 61 is formed on the surface of the oxide film 211. The resist film 212 has an opening pattern that is a striped pattern extending along the second direction Y. In the striped opening pattern of the resist film 212, an opening width w11 and a remaining width w12 between adjacent openings are both, for example, about 2.5 µm.

Next, the oxide film 211 is dry etched using the resist film 212 as a mask to leave the oxide film 211 in a striped opening pattern similar to that of the resist film 212. As a result, portions of the oxide film 211 corresponding to formation regions of the SJ trenches 61 of the first partial parallel pn layer 51 are opened. Subsequently, the resist film 212 is removed.

Figure 7:
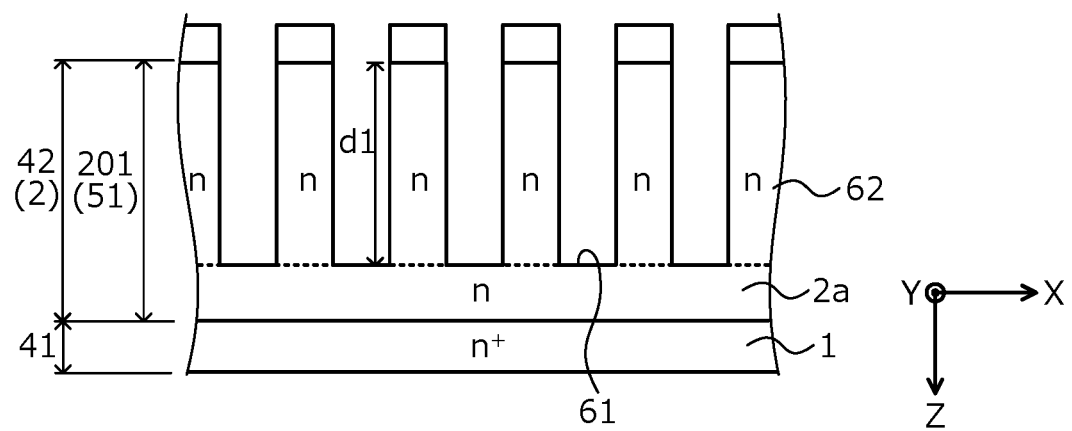
FIG. 7 is a cross-sectional view of a state of the silicon carbide semiconductor device according to the first embodiment during manufacture.

Next, as depicted in FIG. 7, using, as a mask, the portions of the oxide film 211 that is left, the n-type epitaxial layer 201 is dry etched to form the SJ trenches 61 (step S2: second process). The SJ trenches 61 have a depth d1 that is, for example, about 30 µm. The portions of the n-type epitaxial layer 201 left between adjacent SJ trenches 61 of the SJ trenches 61 form the n-type regions 62 of the first partial parallel pn layer 51. Subsequently, the portions of the oxide film 211 that is left are removed by for example, hydrofluoric acid (HF).

A portion of the n-type epitaxial layer 201 closer to the n$^+$-type starting substrate 41 than are bottoms of the SJ trenches 61 forms the normal n-type drift region 2a that is free of the SJ structure. In the process at step S1, before the n-type epitaxial layer 201 is formed, another n-type epitaxial layer that forms an n-type buffer region (not depicted) may be formed on the front surface of the n$^+$-type starting substrate 41. In this case, in the process at step S2, the SJ trenches 61 that penetrate the n-type epitaxial layer 201 in the depth direction Z and reach the n-type buffer region may be formed.

Figure 8:
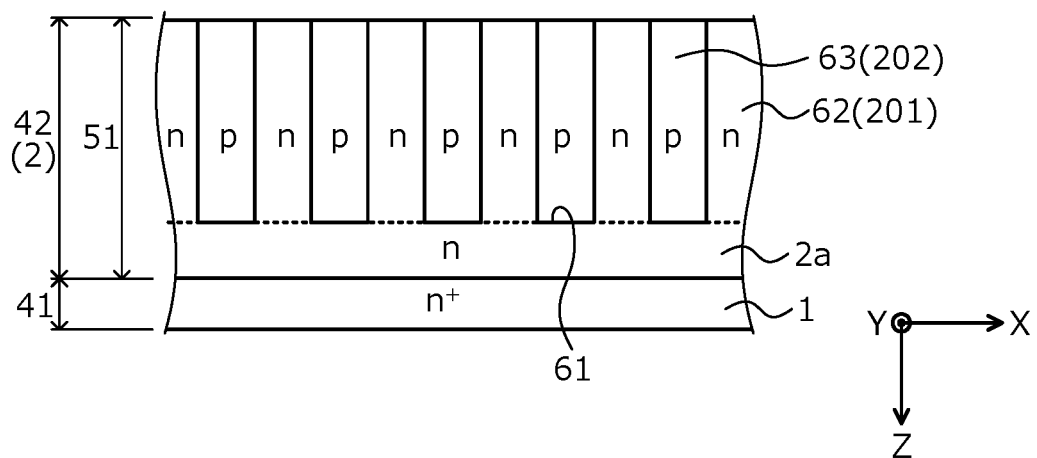
FIG. 8 is a cross-sectional view of a state of the silicon carbide semiconductor device according to the first embodiment during manufacture.

As depicted in FIG. 8, the epitaxial substrate is cleaned by, for example, organic cleaning and RCA cleaning, etc. Next, using a CVD apparatus, a p-type epitaxial layer (second epitaxial layer) 202 that is epitaxially grown (formed) is embedded in the SJ trenches 61 (step S3: third process). In the process at step S3, the p-type epitaxial layer 202 is epitaxially grown in excess on the surface of the n-type epitaxial layer 201 so as to protrude from tops of the SJ trenches 61.

The p-type epitaxial layer 202 may be epitaxially grown by a hydride vapor phase epitaxy (HVPE) method using, for example, a mixed gas in which hydrogen chloride (HCl) gas that is a hydrogen compound is added to a source gas containing, for example, aluminum (Al) as a dopant. The p-type epitaxial layer 202 has an impurity concentration that is, for example, about $1 \times 10^{16}/cm^3$.

Next, by grinding and polishing, an excess portion of the p-type epitaxial layer 202 higher than the surface of the n-type epitaxial layer 201 is removed to leave the p-type epitaxial layer 202 only in the SJ trenches 61 (step S4). The portions of the p-type epitaxial layer 202 left in the SJ trenches 61 become the p-type regions 63 of the first partial parallel pn layer 51.

Next, by CMP, the surfaces of the n-type epitaxial layer 201 and the p-type epitaxial layer 202 are planarized (step S5: first planarization process). As a result, the first partial parallel pn layer 51 having the n-type epitaxial layer 201 and the p-type epitaxial layer 202 as the n-type regions 62 and the p-type regions 63, respectively, is formed as the partial parallel pn layer that is the first layer configuring the drift layer 2, (refer to FIG. 3A).

Next, as depicted in FIG. 9, using a CVD apparatus, an n-type epitaxial layer (third epitaxial layer) 203 is epitaxially grown (formed) on the first partial parallel pn layer 51, as a portion of the epitaxial layer 42 (the drift layer 2) (step S6: fourth process). The n-type epitaxial layer 203 has a thickness t2 that is, for example, about 0.65 µm. The n-type epitaxial layer 203 has an impurity concentration that is substantially equal to the impurity concentration of the n-type epitaxial layer 201.

Next, the resulting epitaxial substrate (epitaxial substrate in which the first partial parallel pn layer 51 and the n-type epitaxial layer 203 are sequentially stacked on the n$^+$-type starting substrate 41) is cleaned by, for example, organic cleaning and RCA cleaning, etc. Next, for example, an oxide film 213 having a thickness of, for example, about 2 µm is formed on the surface of the n-type epitaxial layer 203, using a PCVD apparatus.

Next, by photolithography, a resist film 214 having openings at portions corresponding to formation regions of the p-type regions 65 of the second partial parallel pn layer 52 is formed on the surface of the oxide film 213. The resist film 214 has an opening pattern that is a striped pattern extending along the first direction X orthogonal to the opening pattern of the resist film 212 used in the formation of the first partial parallel pn layer 51, an opening width w13 and a remaining width w14 between adjacent openings thereof are both, for example, about 2.5 µm.

Next, as depicted in FIG. 10, the oxide film 213 is dry etched using the resist film 214 as a mask to leave the oxide film 213 in a striped opening pattern similar to that of the resist film 214. As a result, portions of the oxide film 213 corresponding to formation regions the p-type regions 65 of the second partial parallel pn layer 52 are opened. Subsequently, the resist film 214 is removed. As described above, FIGS. 9 and 10 are cross-sectional views of cross-sections orthogonal to the first direction X.

Next, using, as a mask, the portions of the oxide film 213 that is left, the p-type regions 65 are formed in the n-type epitaxial layer 203 to penetrate through the n-type epitaxial layer 203 in the depth direction Z by an ion implantation 215 of a p-type impurity such as aluminum using a general ion implantation apparatus (step S7: fifth process). The ion implantation 215, for example, may be a multi-stage ion implantation of different acceleration energies for forming a box profile.

The p-type regions 65 have an impurity concentration that is substantially equal to the impurity concentration of the p-type epitaxial layer 202. Portions of the n-type epitaxial layer 203 between adjacent p-type regions 65 among the p-type regions 65 form the n-type regions 64 of the second partial parallel pn layer 52. As a result, the second partial parallel pn layer 52 having the n-type regions 64 and the p-type regions 65 is formed as the partial parallel pn layer that is the second layer configuring the drift layer 2 (refer to FIG. 3B).

Here, an instance in which one layer of the multi-stage epi parallel pn layer (the second partial parallel pn layer 52) is disposed has been described as an example, however, two or more of the multi-stage epi parallel pn layers may be disposed continuously. In this instance, each time the processes from step S6 to step S7 are repeated, a single multi-stage epi partial parallel pn layer may be stacked. In FIG. 5, a single session of this repeated sequence is indicated by an arrow E2 from step S7 to step S6.

Subsequently, for example, the portions of the oxide film 213 that is left are removed by hydrofluoric acid. When two or more of the multi-stage epi parallel pn layers are to be stacked, the p-type regions 65 of the multi-stage epi parallel pn layers each has, relative to impurity concentration distribution in the depth direction Z, a cross-section having one peak and two bottoms. The p-type regions 65 each having a cross-section for which the impurity concentration distribution in the depth direction has one peak and two bottoms are multiple periodic concentration distributions connected in the depth direction Z.

Further, the second partial parallel pn layer 52 may be formed as follows. In the process at step S6, an n⁻-type epitaxial layer having a low impurity concentration may be epitaxially grown to form the second partial parallel pn layer 52. Subsequently, in the process at step S7, instead of the ion implantation 215 for forming the p-type regions 65 of the second partial parallel pn layer 52, an ion implantation for forming the n-type region (diffusion regions) 64 of the second partial parallel pn layer 52 may be performed.

The p-type regions 65 (or the p-type regions 65 and the n-type regions 64) are formed by ion implantation and therefore, crystal defects occur in the second partial parallel pn layer 52. While these crystal defects are recovered by annealing in an instance of silicon, in an instance of silicon carbide, the crystal defects are not recovered even when annealing is performed in a subsequent process and therefore, the crystal defects remain in the second partial parallel pn layer 52. Due to these crystal defects, carrier lifetime in the second partial parallel pn layer 52 is shortened.

In this manner, regions having a short carrier lifetime are formed in the drift layer 2, thereby enabling a reduction of a high injection of carriers when the parasitic diode (body diode) is turned ON. Therefore, an effect is achieved in that hard recovery due to a drawing out of hole carriers in a reverse recovery state of the parasitic diode may be suppressed. The partial parallel pn layers may have impurity amounts that are substantially equal to one another to be in charge balance, an impurity amount being a mathematical product of the impurity concentration and mathematical area of a partial parallel pn layer.

Figure 11:
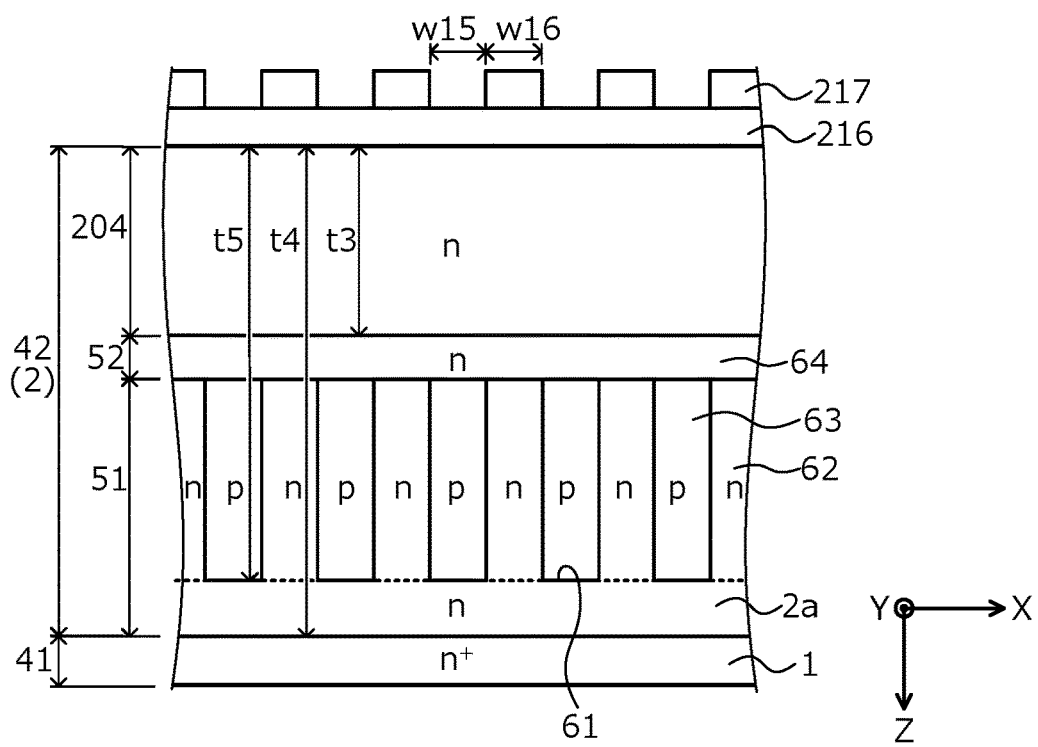
FIG. 11 is a cross-sectional view of a state of the silicon carbide semiconductor device according to the first embodiment during manufacture.

Next, the resulting epitaxial substrate (epitaxial substrate in which the first and the second partial parallel pn layers 51, 52 are sequentially stacked on the n⁺-type starting substrate 41) is cleaned by, for example, organic cleaning and RCA cleaning, etc. Next, as depicted in FIG. 11, an n-type epitaxial layer (fourth epitaxial layer) 204 is epitaxially grown (formed) on the second partial parallel pn layer 52 as a portion of the epitaxial layer 42 (the drift layer 2), using a CVD apparatus (step S8: sixth process).

In the process at step S8, the n-type epitaxial layer 204 has a thickness t3 that is, for example, about 25 μm. The n-type epitaxial layer 204 has an impurity concentration that is substantially equal to the impurity concentration of the n-type epitaxial layer 201. By the processes up to here, the thickness of the epitaxial layer 42 becomes the total thickness t4 of the drift layer 2 (=about 65 μm). Here, the total thickness t4 of the drift layer 2 is an example in a case in which the breakdown voltage of the silicon carbide semiconductor device 50 is 6.5 kV.

Next, the resulting epitaxial substrate (epitaxial substrate in which the first and the second partial parallel pn layers 51, 52 and the n-type epitaxial layer 204 are sequentially stacked on the n⁺-type starting substrate 41) is cleaned by, for example, organic cleaning and RCA cleaning, etc. Next, for example, an oxide film 216 having a thickness of, for example, about 6 μm is formed on the surface of the n-type epitaxial layer 204, using a PCVD apparatus.

Next, by photolithography, a resist film 217 having openings at portions corresponding to formation regions of the SJ trenches 66 is formed on the surface of the oxide film 216. The resist film 217 has an opening pattern that is a striped pattern extending along the second direction Y and similar to the opening pattern of the resist film 212 used in the formation of the first partial parallel pn layer 51, an opening width w15 and a remaining width w16 between adjacent openings thereof are both, for example, about 2.5 μm.

Next, the oxide film 216 is dry etched using the resist film 217 as a mask to leave the oxide film 216 in an opening pattern similar to that of the resist film 217. As a result, portions of the oxide film 216 corresponding to the formation regions of the SJ trenches 66 of the third partial parallel pn layer 53 are opened. Subsequently, the resist film 217 is removed.

Figure 12:
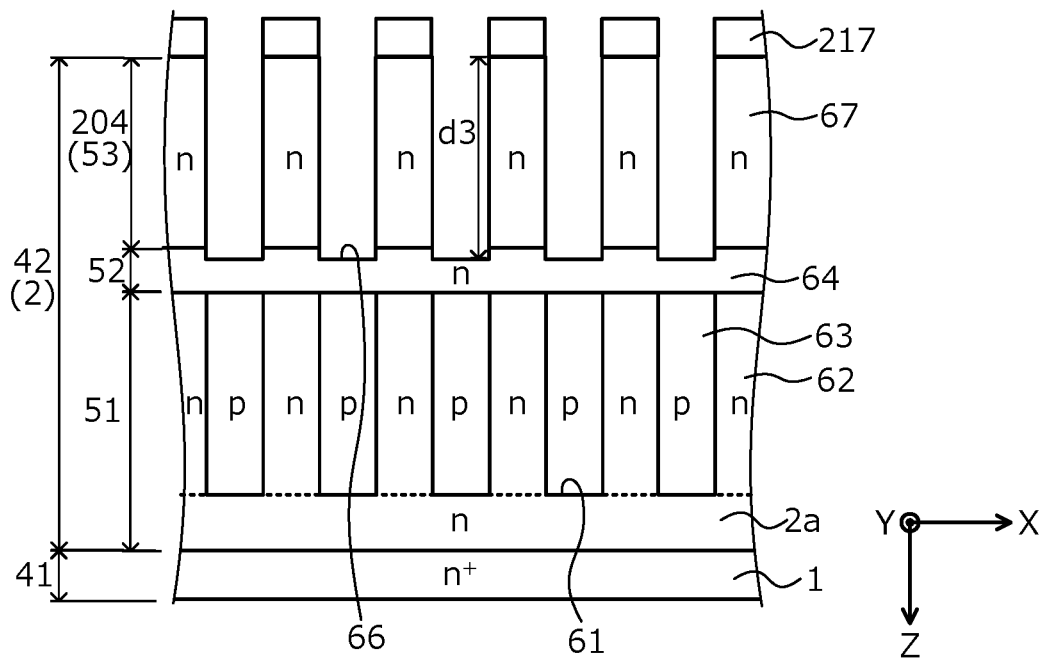
FIG. 12 is a cross-sectional view of a state of the silicon carbide semiconductor device according to the first embodiment during manufacture.

Next, as depicted in FIG. 12, using, as a mask, the portions of the oxide film 216 that is left, the n-type epitaxial layer 204 is dry etched to form the SJ trenches 66 (step S9: seventh process). Here, the SJ trenches 66 are formed to have a width equal to the width of the SJ trenches 61 of the first partial parallel pn layer 51 and therefore, the effect of reducing the ON resistance by the SJ structure may be increased by the SJ trenches 66 and the SJ trenches 61 facing one another in the depth direction Z with as little misalignment as possible.

The SJ trenches 66 have a depth d3 that is a depth penetrating through the n-type epitaxial layer 204 and reaching the second partial parallel pn layer 52 but not penetrating through the second partial parallel pn layer 52 in the depth direction Z. Portions of the n-type epitaxial layer 204 left between adjacent SJ trenches 66 among the SJ trenches 66 become the n-type regions 67 of the third partial parallel pn layer 53. Subsequently, for example, the portions of the oxide film 216 that is left are removed by hydrofluoric acid.

Figure 13:
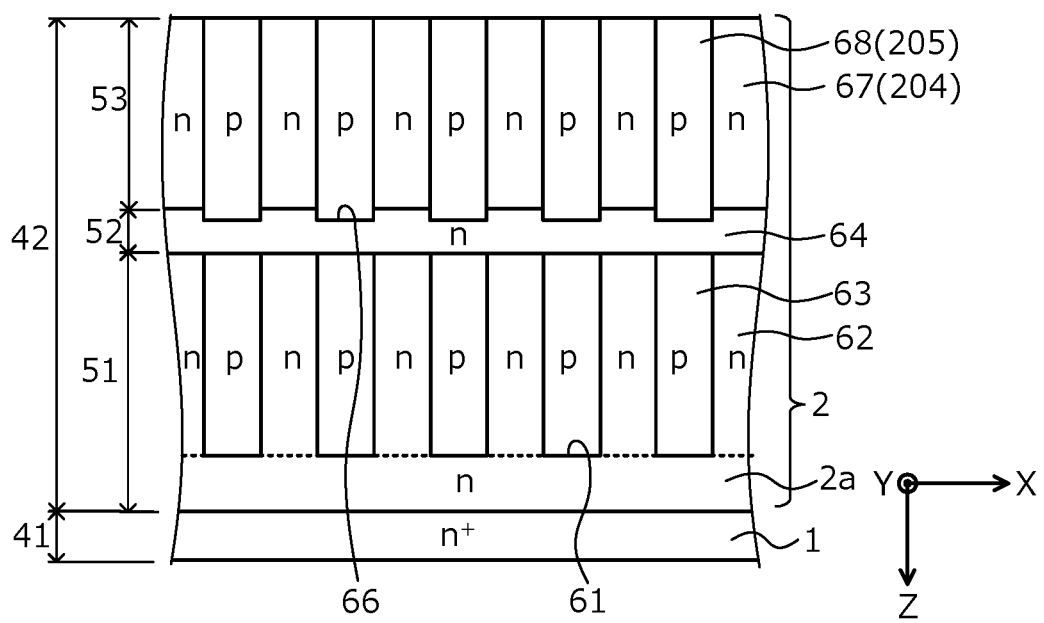
FIG. 13 is a cross-sectional view of a state of the silicon carbide semiconductor device according to the first embodiment during manufacture.

Next, as depicted in FIG. 13, the epitaxial substrate is cleaned by, for example, organic cleaning and RCA cleaning, etc. Next, using a CVD apparatus, a p-type epitaxial layer (fifth epitaxial layer) 205 that is epitaxially grown (formed) is embedded in the SJ trenches 66 (step S10: eighth process). In the process at step S10, the p-type epitaxial layer 205 is epitaxially grown in excess on the surface of the n-type epitaxial layer 204 so as to protrude from tops of the SJ trenches 66.

The p-type epitaxial layer 205, for example, similarly to the epitaxial growth of the p-type epitaxial layer 202, may be epitaxially grown by an HVPE method using a mixed gas in which hydrogen chloride that is a hydrogen compound is added to a source gas containing, for example, aluminum as a dopant. The p-type epitaxial layer 205 has an impurity concentration that is substantially equal to the impurity concentration of the p-type epitaxial layer 202.

Next, by grinding and polishing, an excess portion of the p-type epitaxial layer 205 higher than the surface of the n-type epitaxial layer 204 is removed to leave the p-type epitaxial layer 205 only in the SJ trenches 66 (step S11). The portions of the p-type epitaxial layer 205 left in the SJ trenches 66 become the p-type regions 68 of the third partial parallel pn layer 53.

Next, by CMP, the surfaces of the n-type epitaxial layer 204 and the p-type epitaxial layer 205 are planarized (step S12: second planarization process). As a result, the third partial parallel pn layer 53 having the n-type epitaxial layer 204 and the p-type epitaxial layer 205 as the n-type regions 67 and the p-type regions 68, respectively, is formed as the partial parallel pn layer that is the third layer configuring the drift layer 2 (refer to FIG. 3C).

By the first to the third partial parallel pn layers 51 to 53 formed by the processes up to here, the SJ structure having the thickness t5 that is about 55 μm is formed, whereby the drift layer 2 (the epitaxial layer 42) having the total thickness t4 that is about 65 μm is formed having the full SJ structure in which the n-type regions and the p-type regions each have widths of 2.5 μm (and a repeat pitch of 5.0 μm).

Here, while an instance in which the drift layer 2 having the full SJ structure is configured by three partial parallel pn layers has been described as an example, in an instance in which the number of the stacked partial parallel pn layers configuring the drift layer 2 is increased, for each repetition of the processes from step S6 to step S12 described above, two partial parallel pn layers (multi-stage epi parallel pn layer and embedded-trench parallel pn layer) are formed. In FIG. 5, a single session of this repeated sequence is indicated by an arrow E1 from step S12 to step S6.

For example, in an instance in which the drift layer 2 having the full SJ structure is to be configured by five partial parallel pn layers, embedded-trench parallel pn layers that are the first, the third and the fifth layers each have a thickness of 18 μm and the multi-stage epi parallel pn layers that are the second and the fourth layers each have a thickness of 0.65 μm. As a result, even in an instance in which the drift layer 2 is configured by five partial parallel pn layers, the drift layer 2 may be formed to have a SJ structure of a same thickness as the thickness t5 of the SJ structure in an instance of configuration by the first to the third partial parallel pn layers 51 to 53.

Figure 14:
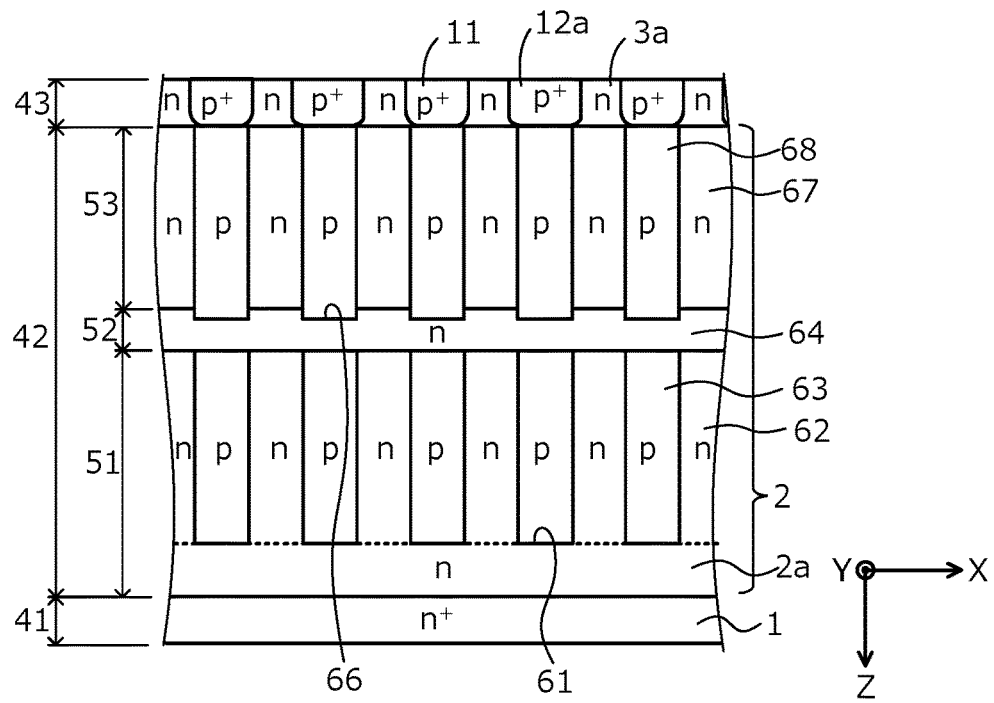
FIG. 14 is a cross-sectional view of a state of the silicon carbide semiconductor device according to the first embodiment during manufacture.

Next, element structures are formed on the drift layer 2 having the full SJ structure (step S13). In particular, first, as depicted in FIG. 14, the n⁻-type epitaxial layer 43 having a thickness of, for example, about 0.5 μm is epitaxially grown (formed) on the third partial parallel pn layer 53, using a CVD apparatus. Next, by photolithography and ion implantation of a p-type impurity, the p⁺-type regions 11 and the p⁺-type regions 12a are formed in surface regions of the type epitaxial layer 43 to be separate from and repeatedly alternate one another along the first direction X.

The p⁺-type regions 11 may be formed at a timing different from that of the p⁺-type regions 12a, and the p⁺-type regions 11 may be formed deeper than the depth of the p⁺-type regions 12 (the p⁺-type regions 12a) to terminate in the third partial parallel pn layer 53 therebelow. In this case, the width of the p⁺-type regions 11 is wider than the width of the p-type regions 68 of the third partial parallel pn layer 53 and narrower than the repeat pitch of the n-type regions 67 and the p-type regions 68. Next, by photolithography and ion implantation of an n-type impurity, n-type regions 3a are formed in surface regions of the n⁻-type epitaxial layer 43.

Figure 15:
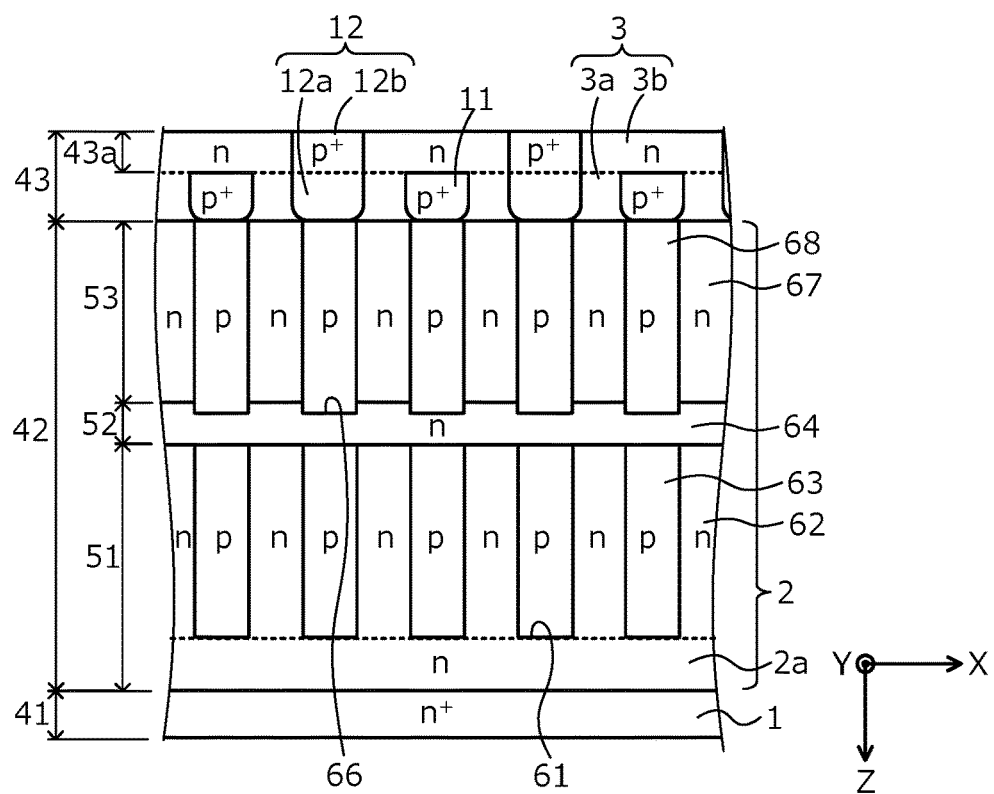
FIG. 15 is a cross-sectional view of a state of the silicon carbide semiconductor device according to the first embodiment during manufacture.

Next, as depicted in FIG. 15, by epitaxial growth, the thickness of the type epitaxial layer 43 is increased. Next, by photolithography and ion implantation of a p-type impurity, the p⁺-type regions 12b are selectively formed a portion 43a that increases the thickness of the n⁻-type epitaxial layer 43, and the p⁺-type regions 12a and the p⁺-type regions 12b respectively adjacent to one another in the depth direction are connected, thereby forming the p⁺-type regions 12.

Next, by photolithography and ion implantation of an n-type impurity, n-type regions 3b are formed in the portion 43a that increases the thickness of the n⁻-type epitaxial layer 43, and the n-type regions 3a and the n-type regions 3b adjacent to one another in the depth direction are connected, thereby forming the n-type current spreading regions 3.

Figure 16:
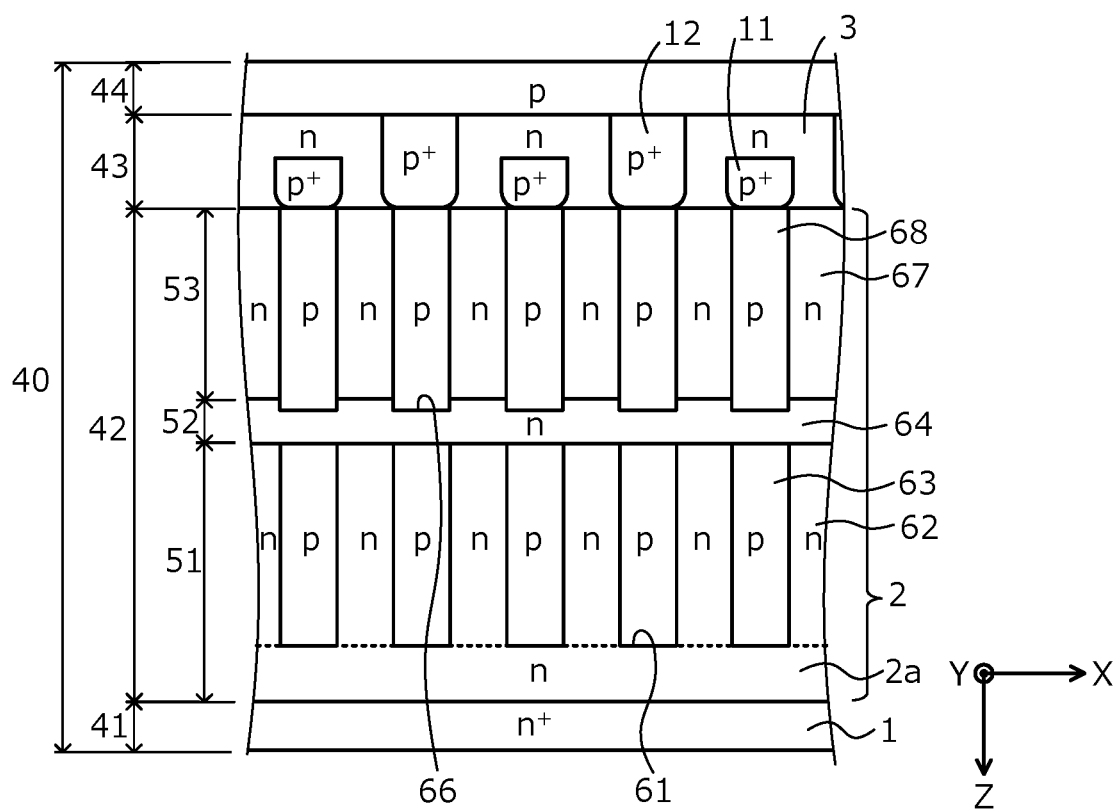
FIG. 16 is a cross-sectional view of a state of the silicon carbide semiconductor device according to the first embodiment during manufacture.

Next, as depicted in FIG. 16, the p-type epitaxial layer 44 that forms the p-type base regions 4 is epitaxially grown on the n⁻-type epitaxial layer 43, using a CVD apparatus. As a result, the epitaxial layer 42, the n⁻-type epitaxial layer 43, and the p-type epitaxial layer 44 are sequentially stacked on the front surface of the n⁺-type starting substrate 41, whereby the semiconductor substrate (semiconductor wafer) 40 is fabricated.

Next, a process including photolithography and ion implantation as one set is repeatedly performed under different conditions to selectively form the n⁺-type source regions 5 and the p⁺⁺-type contact regions 6 in surface regions of the p-type epitaxial layer 44. Portions of the p-type epitaxial layer 44 excluding the n⁺-type source regions 5 and the p⁺⁺-type contact regions 6 form the p-type base regions 4.

Next, by photolithography and etching, the gate trenches 7 that penetrate the n⁺-type source regions 5 and the p-type base regions 4, and reach the n-type current spreading regions 3 are formed. The bottoms of the gate trenches 7, for example, may terminate in the p⁺-type regions 11. Next, a heat treatment for impurity activation is performed for diffusion regions formed by the ion implantations.

Next, along the front surface of the semiconductor substrate 40 and inner walls of the gate trenches 7, the gate insulating films 8 are formed. Next, a polysilicon (poly-Si) layer deposited on the front surface of the semiconductor substrate 40 so as to be embedded in the gate trenches 7 is etched to leave portions thereof only in the gate trenches 7 to thereby form the gate electrodes 9. Next, the interlayer insulating film 14 is formed on an entire area of the front surface of the semiconductor substrate 40.

Next, by a general method, surface electrodes (the source electrode 15 and the drain electrode 16) are formed on the surfaces of the semiconductor substrate 40, respectively (step S14). Components of the intermediate region 20 and the edge termination region 30 (refer to FIG. 2), which are not depicted in FIGS. 6 to 16 are formed at predetermined timings. Thereafter, semiconductor wafer is diced (cut) into individual chips, whereby the silicon carbide semiconductor device 50 depicted in FIGS. 2, 3A, 3B, and 3C is completed.

Figure 22:
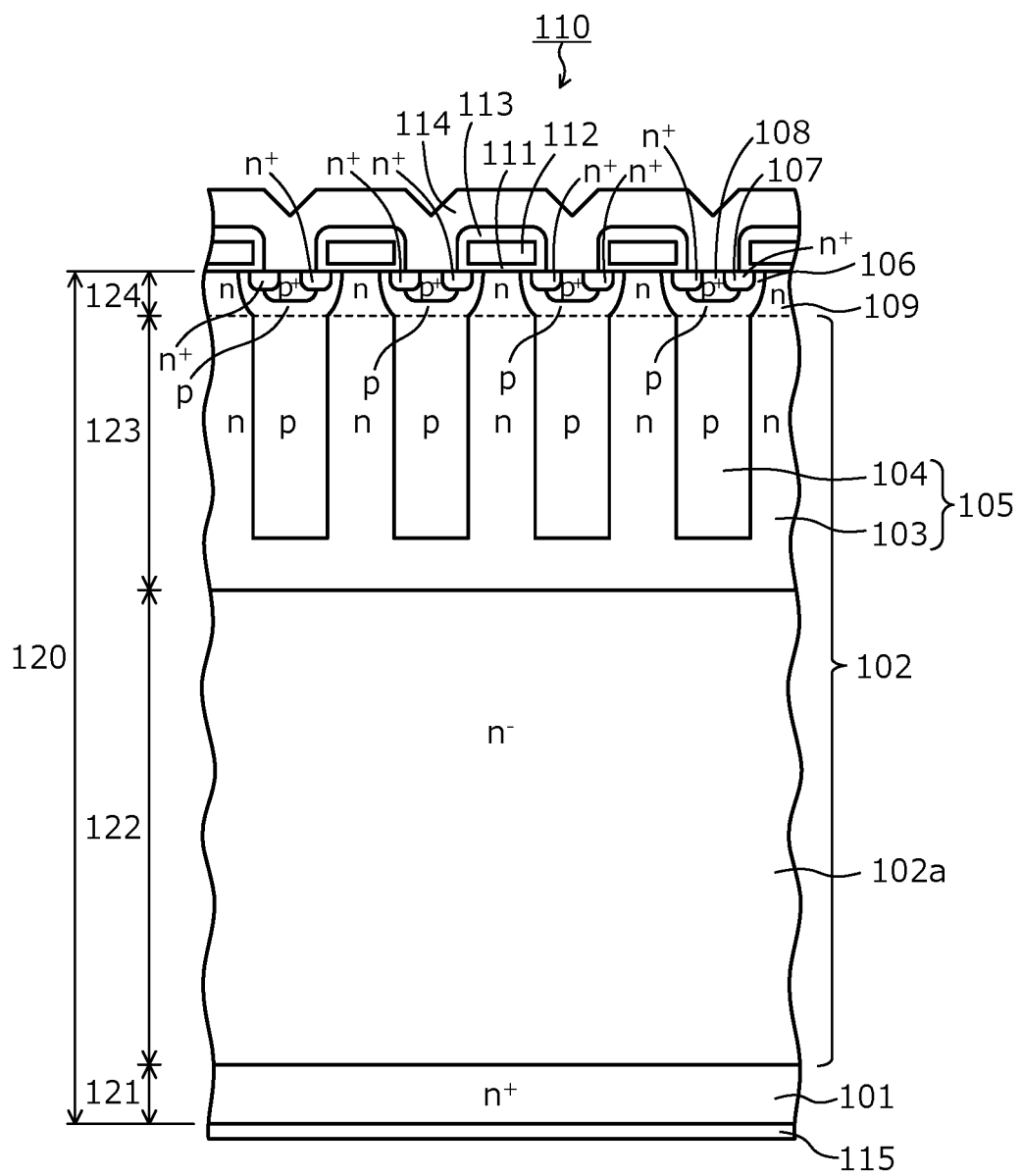
FIG. 22 is a cross-sectional view of a conventional silicon carbide semiconductor device.

As described above, according to the first embodiment, the drift layer has a structure in which at least three embedded-trench parallel pn layers (partial parallel pn layers) and multi-stage epi parallel pn layers (partial parallel pn layers) are alternately stacked repeatedly. As a result, a majority of the total thickness of the drift layer having a thick thickness to realize high breakdown voltage may have a SJ structure (full SJ structure). Therefore, the ON resistance may be reduced as compared to the conventional structure having a partial SJ structure where at least half of the drift layer is a normal n⁻-type drift region without a SJ structure (refer to FIG. 22).

Further, according to the first embodiment, the total thickness of the drift layer may be increased easily by the embedded-trench parallel pn layer among the three or more partial parallel pn layers configuring the drift layer. Further, the greater the number of embedded-trench parallel pn layers is increased, the thinner the thickness of the embedded-trench parallel pn layers may be, thereby enabling the width of the SJ trenches to be reduced. Therefore, the widths of the n-type regions and the p-type regions of the embedded-trench parallel pn layers are reduced, enabling the effect of reducing the ON resistance to be increased.

Further, according to the first embodiment, in forming the embedded-trench parallel pn layers, the depth of the SJ trenches may be made shallower than the total thickness of the drift layer, thereby facilitating the trench etching for the SJ trenches and the embedding of the epitaxial layer in the SJ trenches. Accordingly, manufacturing is easy and characteristics may be improved. Further, according to the first embodiment, an instance in which the thickness of the drift layer is at least 10 μm is useful for a breakdown voltage of at least 1 kV and particularly, an instance in which the thickness of the drift layer is at least 30 μm is useful for a breakdown voltage of at least 3 kV.

Further, according to the first embodiment, when viewed from the front surface of the semiconductor substrate, the striped pattern of the n-type regions and the p-type regions of the embedded-trench parallel pn layers and the striped pattern of the n-type regions and the p-type regions of the multi-stage epi parallel pn layer extend in directions different from one another. As a result, the n-type regions and the p-type regions of one of the embedded-trench parallel pn layers and the n-type regions and the p-type regions of the adjacent embedded-trench parallel pn layer assuredly may be connected respectively in the depth direction Z via the n-type regions and the p-type regions of the multi-stage epi parallel pn layer, respectively.

In this manner, between partial parallel pn layers adjacent to one another in the depth direction, respective n-type regions of each may be connected easily to one another and respective p-type regions of each may be connected easily to one another, thereby enabling formation of alignment marks and alignment for positioning the n-type regions and the p-type regions of the partial parallel pn layers in the depth direction to be omitted. Therefore, particular problems (the alignment mark being buried during epitaxial growth due to plane orientation, etc.) that occur in relation to alignment due to characteristics of silicon carbide may be avoided.

Figure 17:
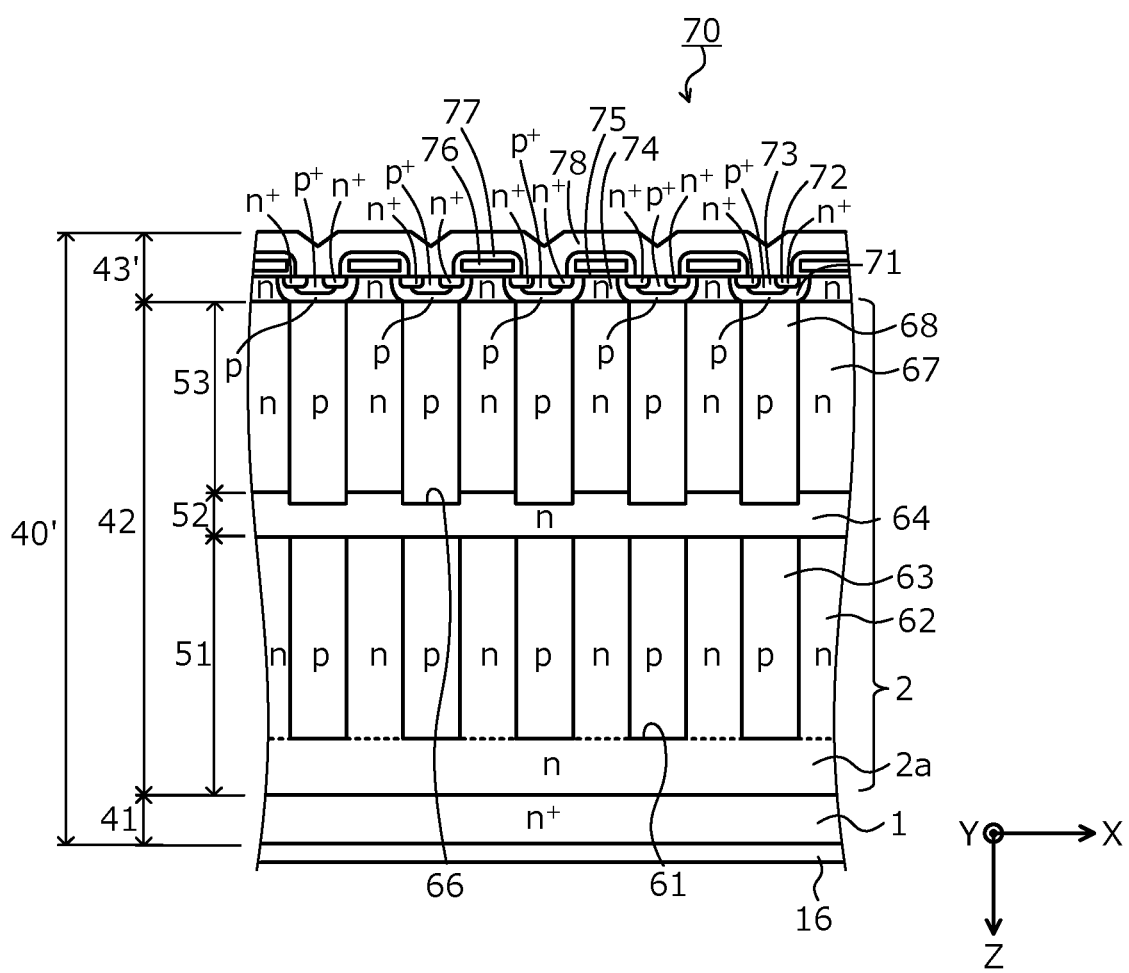
FIG. 17 is a cross-sectional view of a structure of a silicon carbide semiconductor device according to a second embodiment.

Next, a structure of a silicon carbide semiconductor device according to a second embodiment will be described. FIG. 17 is a cross-sectional view of the structure of the silicon carbide semiconductor device according to the second embodiment. A silicon carbide semiconductor device 70 according to the second embodiment differs from the silicon carbide semiconductor device 50 according to the first embodiment (FIG. 2) in that the silicon carbide semiconductor device 70 has a planar gate structure instead of the trench gate structure. The silicon carbide semiconductor device 70 according to the second embodiment includes components of a general planar gate structure on the drift layer 2 having the full SJ structure (the epitaxial layer 42) similar to that of the first embodiment.

In particular, in the second embodiment, a semiconductor substrate 40' is formed by the n$^+$-type starting substrate 41 containing silicon carbide and sequentially deposited on the front surface of the n$^+$-type starting substrate 41, the epitaxial layer 42 that is the drift layer 2 having the full SJ structure similarly to the first embodiment and an n-type epitaxial layer 43' that forms n-type JFET regions 74. The semiconductor substrate 40' has a main surface that is a surface of the n-type epitaxial layer 43' and regarded as a front surface of the semiconductor substrate 40', and another main surface that is the back surface of the n$^+$-type starting substrate 41 and regarded as a back surface of the semiconductor substrate 40'.

In the n-type epitaxial layer 43', p-type base regions 71 that penetrate through the n-type epitaxial layer 43' in the depth direction are selectively provided. The p-type base regions 71 are adjacent to the p-type regions 68 of the third partial parallel pn layer 53 in the depth direction Z. Between the front surface of the semiconductor substrate 40' and the p-type base regions 71, n$^+$-type source regions 72 and p$^+$-type contact regions 73 are each selectively provided in contact with the p-type base regions 71 and so as to be exposed at the front surface of the semiconductor substrate 40'.

Portions of the n-type epitaxial layer 43' excluding the p-type base regions 71, the n$^+$-type source regions 72, and the p$^+$-type contact regions 73 are the n-type JFET regions 74. The n-type JFET regions 74 are exposed at the front surface of the semiconductor substrate 40'. The n$^+$-type source regions 72 are provided separate from the n-type JFET regions 74. Between the n$^+$-type source regions 72 and the n-type JFET regions 74, the p-type base regions 71 are present. The p$^+$-type contact regions 73 are provided further from the n-type JFET regions 74 than are the n$^+$-type source regions 72.

On surfaces of portions of the p-type base regions 71 sandwiched between the n$^+$-type source regions 72 and the n-type JFET regions 74, gate electrodes 76 are provided via gate insulating films 75. On an entire area of the front surface of the semiconductor substrate 40, an interlayer insulating film 77 is provided so as to cover the gate electrodes 76. A source electrode 78 is electrically connected to the n$^+$-type source regions 72 and the p$^+$-type contact regions 73 through contact holes opened in the interlayer insulating film 77. Configuration of a back portion (lower portion) of the semiconductor substrate 40' from the drift layer 2 is similar to that of the first embodiment.

Figure 18:
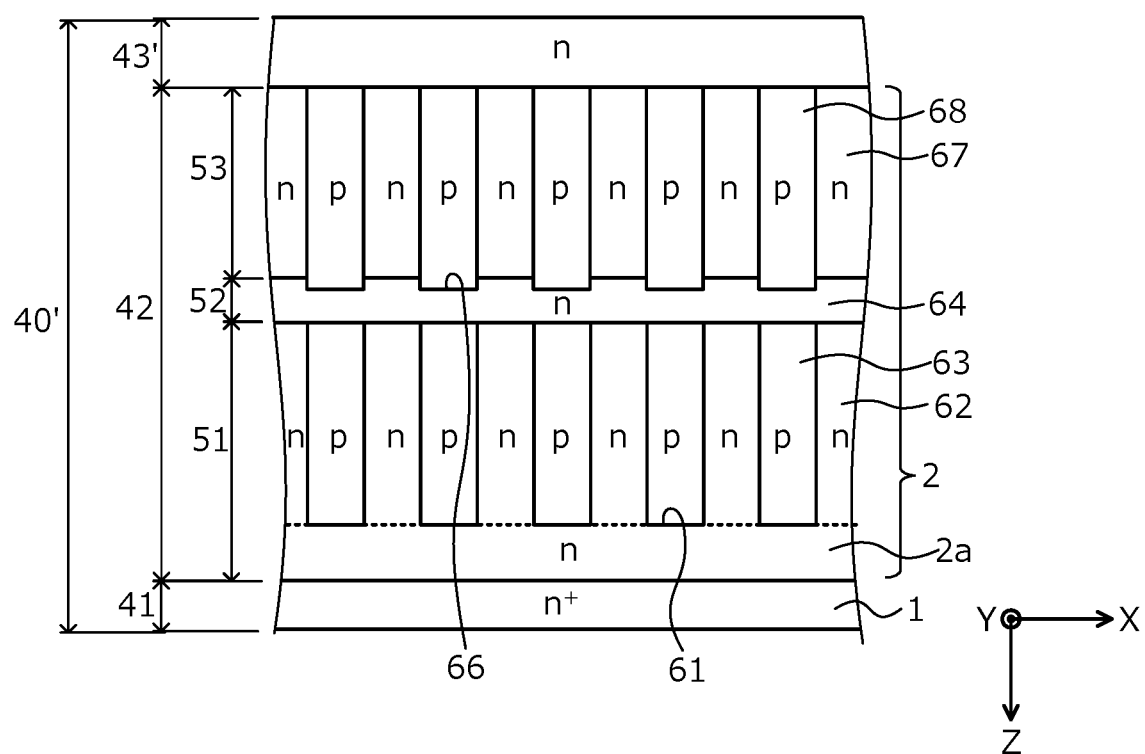
FIG. 18 is a cross-sectional view of a state of the silicon carbide semiconductor device according to the second embodiment during manufacture.

A method of manufacturing the silicon carbide semiconductor device 70 according to the second embodiment suffices to include in the method of manufacturing the silicon carbide semiconductor device 50 according to the first embodiment (refer to FIG. 5), formation of the planar gate structure by a general method instead of the gate trench structure at step S13. FIG. 18 is a cross-sectional view of a state of the silicon carbide semiconductor device according to the second embodiment during manufacture. In other words, in particular, first, similarly to the first embodiment, the processes at steps S1 to S12 are performed.

Next, as depicted in FIG. 18, in the process at step S13, on the third partial parallel pn layer 53, the n-type epitaxial layer 43' that forms the n-type JFET regions 74 is epitaxially grown (formed). As a result, the semiconductor substrate (semiconductor wafer) 40' in which the epitaxial layer 42 and the n-type epitaxial layer 43' are sequentially formed on the front surface of the n$^+$-type starting substrate 41 is fabricated.

Next, a process including photolithography and ion implantation as one set is repeatedly performed under different conditions to selectively form the p-type base regions 71, the n$^+$-type source regions 72, and the p$^+$-type contact regions 73 in surface regions of the n-type epitaxial layer 43'. Portions of the n-type epitaxial layer 43' excluding the p-type base regions 71, the n$^+$-type source regions 72 and the p$^+$-type contact regions 73 become the n-type JFET regions 74.

Next, the gate insulating films 75 are formed on an entire area of the front surface of the semiconductor substrate 40'. Next, a polysilicon layer is formed on the front surface of the semiconductor substrate 40' and patterned to leave the polysilicon layer on surfaces between pairs of the n$^+$-type source regions 72 adjacent to one another and sandwiching an n-type JFET region 74, as the gate electrodes 76. Next, the interlayer insulating film 14 is formed on an entire area of the front surface of the semiconductor substrate 40. Thereafter, the processes from step S14 are sequentially performed, whereby the silicon carbide semiconductor device 70 depicted in FIG. 17 is completed.

As described above, according to the second embodiment, even in an instance in which the first embodiment is applied to a planar gate structure, effects similar to those of the first embodiment may be obtained.

Figure 19:
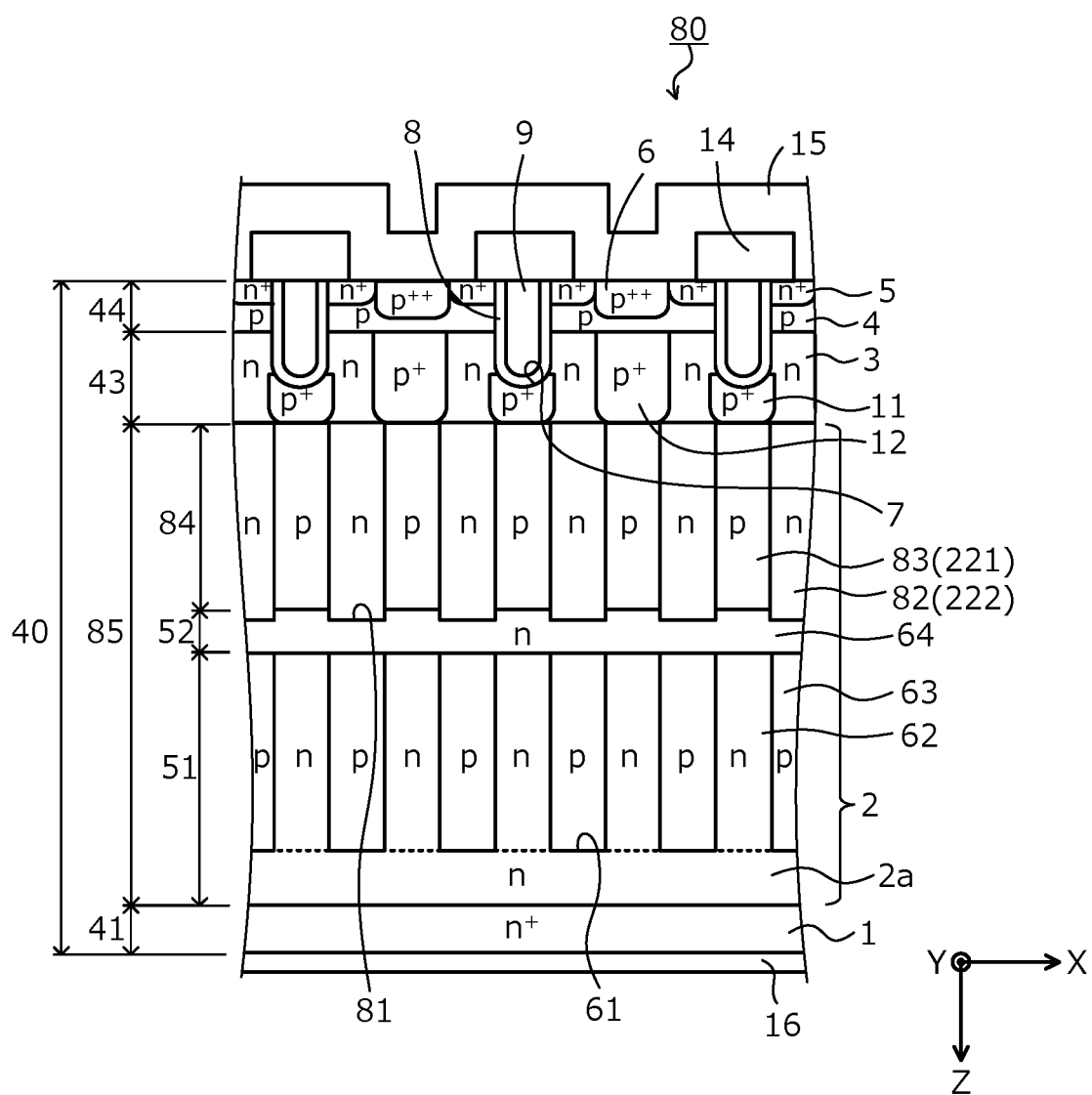
FIG. 19 is a cross-sectional view of a structure of a silicon carbide semiconductor device according to a third embodiment.

Next, a structure of a silicon carbide semiconductor device according to a third embodiment will be described. FIG. 19 is a cross-sectional view of the structure of the silicon carbide semiconductor device according to the third embodiment. A silicon carbide semiconductor device 80 according to the third embodiment differs from the silicon carbide semiconductor device 50 according to the first embodiment (FIG. 2) in that SJ trenches 81 are formed in a p-type epitaxial layer 221 that forms p-type regions 83 of a third partial parallel pn layer 84 (embedded-trench parallel pn layer) and an n-type epitaxial layer 222 that forms n-type regions 82 is embedded in the SJ trenches 81.

A method of manufacturing the silicon carbide semiconductor device 80 according to the third embodiment suffices to include in the method of manufacturing the silicon carbide semiconductor device 50 according to the first embodiment (refer to FIG. 5), performing the processes at steps S8 to S11 with the conductivity types (n-type, p-type) inverted. In particular, first, similarly to the first embodiment, the processes at steps S1 to S7 are performed. Next, in the process at step S8, the p-type epitaxial layer 221 is epitaxially grown (formed) on the second partial parallel pn layer 52 as a portion of an epitaxial layer 85 (the drift layer 2).

Next, in the process at step S9, the SJ trenches 81 are formed in the p-type epitaxial layer 221. Portions of the p-type epitaxial layer 221 left between adjacent trenches among the SJ trenches 81 form the p-type regions 83 of the third partial parallel pn layer 84. The SJ trenches 81, similarly to the first embodiment, suffice to be formed by using an oxide film mask having openings at portions corresponding to formation regions of the n-type regions 82. Next, in the process at step S10, the n-type epitaxial layer 222 is embedded in the SJ trenches 81.

Portions of the n-type epitaxial layer 222 epitaxially grown in the process at step S10 are left in the SJ trenches 81 to become the n-type regions 82 of the third partial parallel pn layer 84. Thus, in the process at step S11, excess portions of the n-type epitaxial layer 222 epitaxially grown outside of the SJ trenches 81 are removed to leave the n-type epitaxial layer 222 only in the SJ trenches 81. Thereafter, the processes from step S12 are sequentially performed, whereby the silicon carbide semiconductor device 80 depicted in FIG. 19 is completed.

The first partial parallel pn layer 51 (embedded-trench parallel pn layer) closest to the drain electrode 16 cannot be formed similarly to the first embodiment by inverting the conductivity types like the third partial parallel pn layer 84 described above. A reason for this is that an entire area of a portion in which the SJ structure is not formed (portion corresponding to the n-type drift region 2a in FIG. 2) between the n$^+$-type starting substrate 41 and the first partial parallel pn layer 51 becomes a p-type region, whereby pn junctions between the p-type region and the n$^+$-type starting substrate 41 are formed.

Further, exposure of the opening pattern for an etching mask for forming the SJ trenches 81 may be performed by a reticle (not depicted) used in the exposure of the opening pattern for the resist film 212 (refer to FIG. 6) used as a mask for forming the opening pattern in the oxide film 211 (refer to FIGS. 6 and 7) that is an etching mask for forming the SJ trenches 61 of the first partial parallel pn layer 51. In this instance, the p-type regions 83 of the third partial parallel pn layer 84 are disposed at positions facing the n-type regions 62 of the first partial parallel pn layer 51 in the depth direction Z.

The SJ trenches 81 may be formed so that the p-type regions 83 of the third partial parallel pn layer 84 face the n-type regions 62 of the first partial parallel pn layer 51 in the depth direction Z. In this instance, the SJ trenches 81 suffice to be formed using an etching mask (oxide film) having openings in an opening pattern that is the opening pattern for the resist pattern used as a mask for forming an opening pattern for the etching mask (oxide film) for forming the SJ trenches 81, shifted by a width (one column) of the n-type regions 62 along the first direction X.

The second embodiment may be applied to the silicon carbide semiconductor device 80 according to the third embodiment to have the planar gate structure instead of the trench gate structure.

As described above, according to the third embodiment, even in an instance in which the conductivity types of the embedded-trench parallel pn layers (excluding the first partial parallel pn layer) configuring the drift layer are inverted, effects similar to those of the first and the second embodiments may be achieved.

Figure 20:
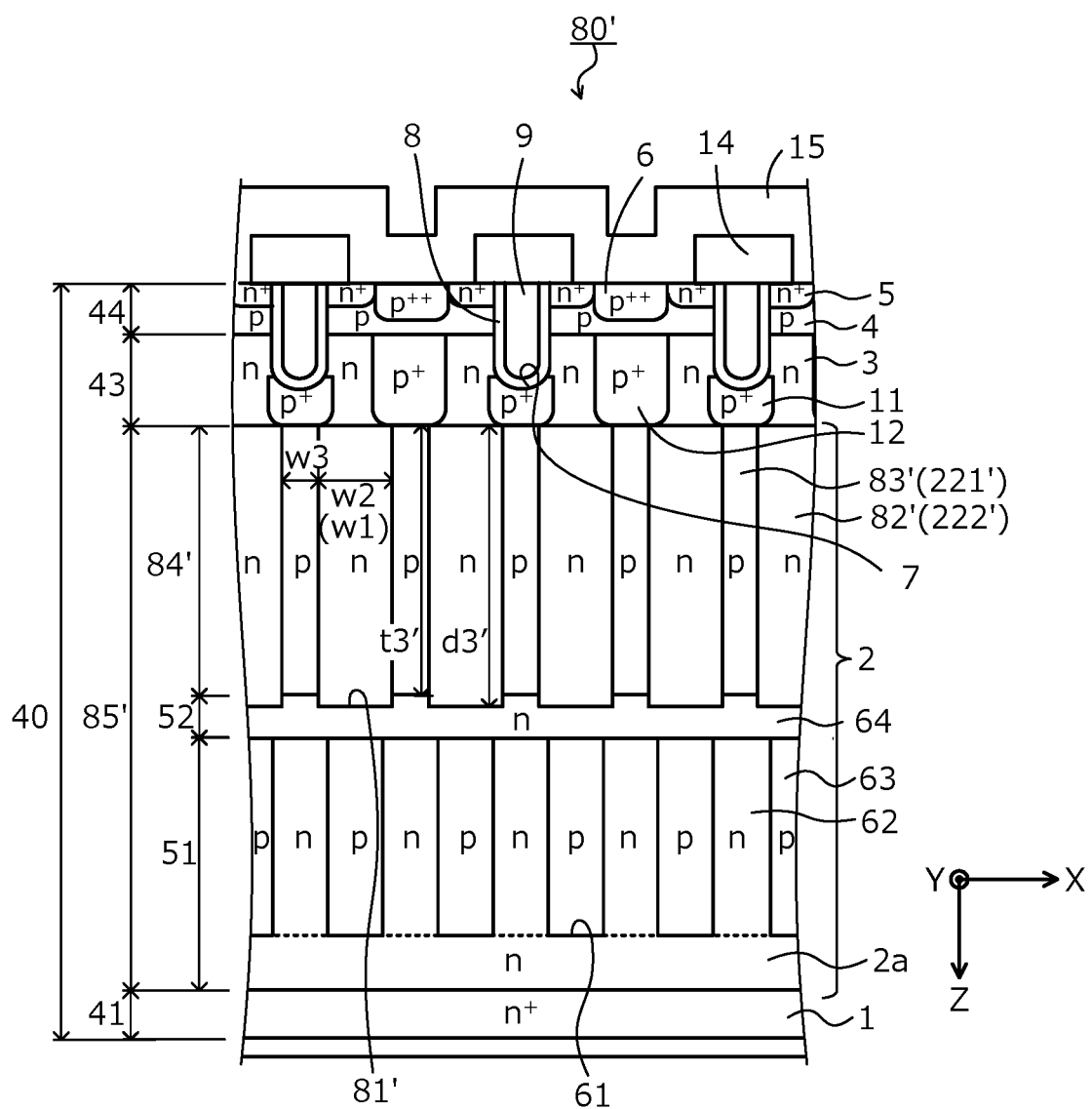
FIG. 20 is a cross-sectional view of a structure of a silicon carbide semiconductor device according to a fourth embodiment.

Next, a structure of a silicon carbide semiconductor device according to a fourth embodiment will be described. FIG. 20 is a cross-sectional view of the structure of the silicon carbide semiconductor device according to the fourth embodiment. A silicon carbide semiconductor device 80' according to the fourth embodiment differs from the silicon carbide semiconductor device 80 according to the third embodiment (FIG. 19) in that a width w1 of the SJ trenches 81' of the third partial parallel pn layer 84' (embedded-trench parallel pn layer) is increased so that a width w2 of the n-type regions 82' of the third partial parallel pn layer 84' is wider than a width w3 of the p-type regions 83'.

In each of the partial parallel pn layers configuring the drift layer 2, the n-type regions and the p-type regions suffice to be nearly charge balanced, and the respective widths of the n-type region and the p-type region may differ. For example, in the third partial parallel pn layer 84', the width w2 of the n-type regions 82' and the width w3 of the p-type regions 83' may be about 3.0 μm and about 1.5 μm, respectively. In this instance, a thickness t3' of the third partial parallel pn layer 84' may be increased, thereby enabling a depth d3' of the SJ trenches 81' to be increased. The depth d3' of the SJ trenches 81' is, for example, about 35 μm.

Even when the depth d3' of the SJ trenches 81' is increased, the width w1 of the SJ trenches 81' is increased, whereby in the p-type epitaxial layer 221' that forms the p-type regions 83' of the third partial parallel pn layer 84', the SJ trenches 81' having a favorable trench-shape in which the sidewalls are substantially orthogonal to the main surfaces of the semiconductor substrate 40 are easily formed. Further, the width w1 of the SJ trenches 81' is increased, whereby problems occurring when the n-type epitaxial layer 222' that forms the n-type regions 82' of the third partial parallel pn layer 84' is embedded in the SJ trenches 81' may be easily avoided.

A problem occurring when the n-type epitaxial layer 222' is embedded in the SJ trenches 81' is an instance in which the n-type epitaxial layer 222' that is epitaxially grown becomes connected to both sidewalls of one or more of the SJ trenches 81' near the top of the opening of the SJ trenches 81', whereby the top of the opening of the SJ trenches 81' becomes blocked and the n-type epitaxial layer 222' cannot be embedded. This problem is easily avoided, whereby the n-type epitaxial layer 222' is easily embedded in the SJ trenches 81' completely and the effect of reducing the ON resistance by the SJ structure is increased.

The n-type regions 82' and the p-type regions 83' of the third partial parallel pn layer 84' are nearly charge balanced. Therefore, the p-type regions 83' has a p-type impurity concentration that is higher than an n-type impurity concentration of the n-type regions 82'. In an instance in which the p-type impurity concentration of the p-type regions differs according to the partial parallel pn layer configuring the drift layer 2, the p-type impurity concentration of the p-type regions of the uppermost partial parallel pn layer may be set to be the highest while the p-type impurity concentration of the p-type regions of the other partial parallel pn layers is lower the closer the partial parallel pn layer thereof is to the drain electrode.

Therefore, the p-type impurity concentrations of the p-type regions 62, 65 of the first and the second partial parallel pn layer 51, 52 suffices to be at most the p-type impurity concentration of the p-type regions 83' of the third partial parallel pn layer 84'. In an instance in which the p-type impurity concentration of the p-type regions differs according to the partial parallel pn layer by the p-type impurity concentration of the p-type regions 83' of the third partial parallel pn layer 84' that is closest to the source electrode being set to be the highest while the p-type impurity concentrations of the p-type regions of the first and the second partial parallel pn layer 51, 52 are respectively set to be lower the closer the first and the second partial parallel pn layer 51, 52 are to the drain electrode, the effect of reducing the ON resistance by the SJ structure may be increased.

A method of manufacturing the silicon carbide semiconductor device 80' according to the fourth embodiment includes in the method of manufacturing the silicon carbide semiconductor device 80 according to the third embodiment, relatively increasing the thickness t3' of the p-type epitaxial layer 221' that is a portion of the epitaxial layer 85' (the drift layer 2), relatively increasing the depth d3' of the SJ trenches 81' forming the p-type epitaxial layer 221', and relatively increasing the width w1 of the SJ trenches 81'.

The second embodiment may be applied to the silicon carbide semiconductor device 80' according to the fourth embodiment to have the planar gate structure instead of the trench gate structure.

As described above, according to the fourth embodiment, even when the widths of the n-type regions and the p-type regions differ for partial parallel pn layers configuring the drift layer, effects similar to those of the first to the third embodiments may be obtained provided the n-type region and the p-type regions are nearly charge balanced in each partial parallel pn layer configuring the drift layer.

Figure 21:
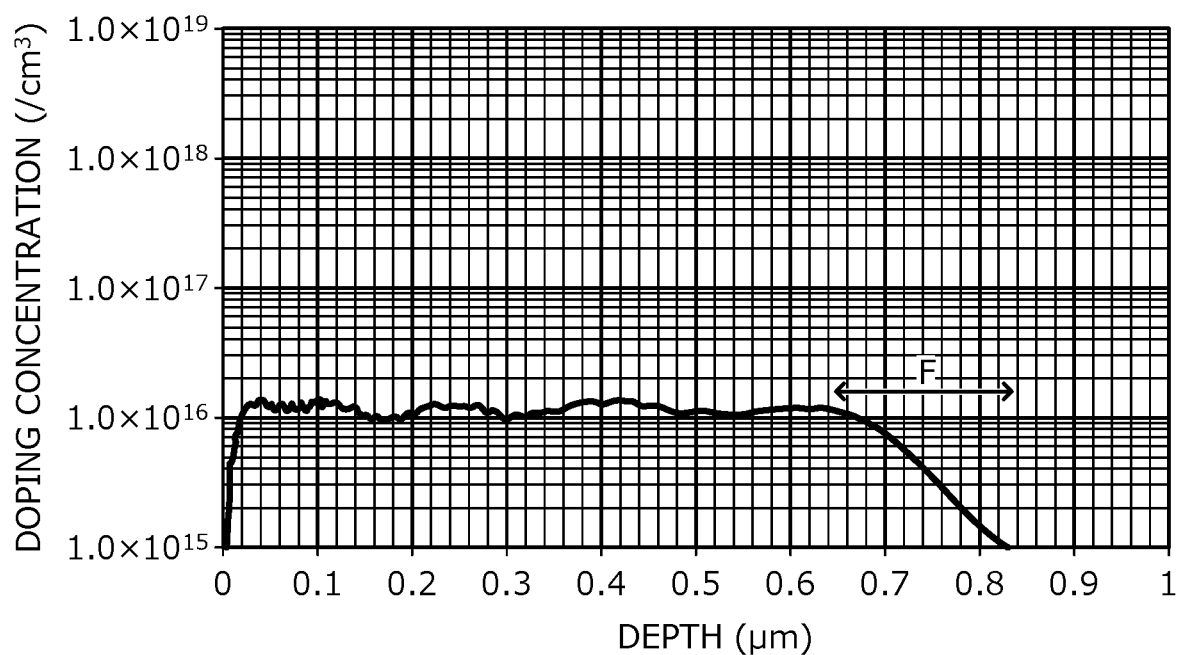
FIG. 21 is a characteristics diagram of doping concentration of ion implanted regions of a multi-stage epi parallel pn layer.

Next, an example will be described in which the thickness t2 (refer to FIGS. 2, 9, 10) of the second partial parallel pn layer 52 (multi-stage epi parallel pn layer) was verified will be described. FIG. 21 is a characteristics diagram of the doping concentration of ion implanted regions of the multi-stage epi parallel pn layer. In FIG. 21, a horizontal axis indicates depth from the ion implantation surface and a vertical axis indicates the doping concentration of aluminum. A box profile of about $1 \times 10^{16}/cm^3$ for p-type regions formed in an n-type epitaxial layer containing silicon carbide, by ion-implanting aluminum in multiple stages of differing acceleration energies (hereinafter, multi-stage ion implantation) is depicted in FIG. 21.

The multi-stage ion implantation is equivalent to the ion implantation 215 (refer to FIG. 10) for forming the p-type regions 65 of the second partial parallel pn layer 52. The n-type epitaxial layer in which the multi-stage ion implantation is performed is equivalent to the n-type epitaxial layer 203 (FIGS. 9, 10) configuring the second partial parallel pn layer 52. The box profile of the p-type regions depicted in FIG. 21 is equivalent to a doping concentration distribution of the p-type regions 65 of the second partial parallel pn layer 52.

The multi-stage ion implantation was performed from a direction orthogonal to the ion implantation surface in eight stages (eight times) of differing acceleration energies under a temperature environment of 500 degrees C. While a box profile is formed by the epitaxial growth, in the depth direction Z, the impurity concentration of the semiconductor regions having a box profile and formed by ion implantation is not uniform and has a periodic concentration distribution compared to semiconductor regions formed by epitaxial growth and having a box profile.

The multi-stage ion implantation was performed under the following conditions using a general ion implantation apparatus. The acceleration energy and dose amount of a first stage of the ion implantation were 700 keV and $2.20 \times 10^{11}/cm^2$, respectively. The acceleration energy and dose amount of a second stage of the ion implantation were 550 keV and $8.00 \times 10^{11}/cm^2$, respectively. The acceleration energy and dose amount of a third stage of the ion implantation were 400 keV and $2.00 \times 10^{11}/cm^2$, respectively. The acceleration energy and dose amount of a fourth stage of the ion implantation were 220 keV and $1.50 \times 10^{11}/cm^2$, respectively. The acceleration energy and dose amount of a fifth stage of the ion implantation were 100 keV and $1.00 \times 10^{11}/cm^2$, respectively. The acceleration energy and dose amount of a sixth stage of the ion implantation was 50 keV and $3.00 \times 10^{10}/cm^2$, respectively. The acceleration energy and dose amount of a seventh stage of the ion implantation were 30 keV and $2.00 \times 10^{11}/cm^2$, respectively. The acceleration energy and dose amount of an eight stage of the ion implantation were 20 keV and $1.50 \times 10^{11}/cm^2$, respectively.

From the results depicted in FIG. 21, the doping concentration was confirmed to have a box profile of about $1 \times 10^{16}/cm^3$ from the ion implantation surface to a depth of 0.65 μm and was confirmed to decrease as the depth increased from 0.65 μm from the ion implantation surface (portion indicated by reference character F). Therefore, the thickness t2 of the second partial parallel pn layer 52 suffices be at most about 0.65 μm. Further, while portions having a low impurity concentration occur in surface regions of the ion implantation surface, the inventor confirmed that these portions are removed by hydrogen etching when a subsequent epitaxial layer is formed thereon.

In the foregoing, the present invention is not limited the embodiments described above and various modifications within a range not departing from the spirit of the invention are possible.

According to the invention described above, the drift layer has a structure in which three or more layers of a partial parallel pn layer (embedded-trench parallel pn layer) formed by the trench embedding epitaxial process and a partial parallel pn layer (multi-stage epi parallel pn layer) formed by the multi-stage epitaxial process are stacked repeatedly alternating one another, whereby a majority of the total thickness of the drift layer that has an increased thickness for realizing high breakdown voltage may have the SJ structure (full SJ structure).

Further, according to the invention described above, the embedded-trench parallel pn layers (first and third partial parallel pn layers) are formed having thicknesses that are less that the total thickness of the drift layer and therefore, in the formation of the embedded-trench parallel pn layers, the depths of the SJ trenches (first and second trenches) may be set to be shallower than the total thickness of the drift layer, whereby the trench etching for the SJ trenches and the embedding of an epitaxial layer in the SJ trenches are facilitated.

Further, according to the invention described above, of the three or more partial parallel pn layers configuring the drift layer, the total thickness of the drift layer may be easily increased by the embedded-trench parallel pn layers. Further, as the number of layers of the embedded-trench parallel pn layers increases, the thickness of each embedded-trench parallel pn layer may be reduced, thereby enabling the widths of the SJ trenches to be decreased. Thus, the widths of the n-type regions and the p-type regions of the embedded-trench parallel pn layers may be reduced, thereby enabling the effect of reducing the ON resistance to be increased.

The method of manufacturing a silicon carbide semiconductor device, the method of manufacturing a silicon carbide substrate, and the silicon carbide substrate according to the present invention achieve an effect in that a silicon carbide substrate having a SJ structure and a silicon carbide semiconductor device having a SJ structure may be manufactured easily and characteristics may be improved.

As described above, the method of manufacturing a silicon carbide semiconductor device, the method of manufacturing a silicon carbide substrate, and the silicon carbide substrate according to the present invention are useful for silicon carbide semiconductor devices having a breakdown voltage of at least 1 kV and are particularly suitable for silicon carbide semiconductor devices having a breakdown voltage of at least 3.3 kV.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A silicon carbide substrate, comprising:
a starting substrate containing silicon carbide;
a parallel pn layer including
a first partial parallel pn layer stacked on the starting substrate,
a second partial parallel pn layer stacked on the first partial parallel pn layer, and
a third partial parallel pn layer stacked on the second partial parallel pn layer, wherein
each of the first, second and third partial parallel pn layers has a plurality of first-conductivity-type regions and a plurality of second-conductivity-type regions alternately disposed in parallel to a main surface of the silicon carbide substrate;
the plurality of first-conductivity-type regions and the plurality of second-conductivity-type regions of the third partial parallel pn layer are respectively adjacent to the plurality of first-conductivity-type regions and the plurality of second-conductivity-type regions of the second partial parallel pn layer;
the plurality of first-conductivity-type regions of the first and third partial parallel pn layers face each other in a depth direction of the silicon carbide substrate, and the plurality of second-conductivity-type regions of the first and third partial parallel pn layers face each other in the depth direction;
the plurality of first-conductivity-type regions and the plurality of second-conductivity-type regions in each of the first, second and third partial parallel pn layers extend in a striped pattern parallel to the main surface, and are disposed to alternate one another along a direction orthogonal to a direction along which the striped pattern extends; and
a first direction along which the striped pattern of the plurality of first-conductivity-type regions and the plurality of second-conductivity-type regions of the second partial parallel pn layer extends, and a second direction along which the striped pattern of the plurality of first-conductivity-type regions and the plurality of second-conductivity-type regions of the first partial parallel pn layer extends, are different from each other, wherein
crystal defects are formed in the plurality of second-conductivity-type regions of the second partial parallel pn layer or in an entire area of the second partial parallel pn layer.

2. The silicon carbide substrate according to claim 1, wherein the first partial parallel pn layer includes
a first epitaxial layer of a first conductivity type containing silicon carbide,
a plurality of first trenches reaching a predetermined depth from a surface of the first epitaxial layer, and
a second epitaxial layer of a second conductivity type, embedded in the plurality of first trenches, wherein
portions of the first epitaxial layer between adjacent first trenches among the plurality of first trenches constitute the plurality of first-conductivity-type regions of the first partial parallel pn layer, and
the second epitaxial layer embedded in the plurality of first trenches constitute the plurality of second-conductivity-type regions of the first partial parallel pn layer.

3. The silicon carbide substrate according to claim 1, wherein the second partial parallel pn layer includes
an epitaxial layer of a first conductivity type containing silicon carbide, and
a plurality of diffusion regions, each containing an impurity of a second conductivity type, introduced in the epitaxial layer, wherein
the plurality of diffusion regions constitute the plurality of second-conductivity-type regions of the second partial parallel pn layer, and
portions of the epitaxial layer excluding the plurality of diffusion regions constitute the plurality of first-conductivity-type regions of the second partial parallel pn layer.

4. The silicon carbide substrate according to claim 1, wherein the second partial parallel pn layer has:
an epitaxial layer of a first conductivity type containing silicon carbide, a plurality of first diffusion regions, each containing an impurity of a second conductivity type, introduced in the epitaxial layer, the plurality of first diffusion regions constituting the plurality of second-conductivity-type regions of the second partial parallel pn layer, and
a plurality of second diffusion regions, each containing an impurity of the first conductivity type, introduced in the epitaxial layer, an impurity concentration of the plurality of second diffusion regions being higher than that of the epitaxial layer, the plurality of second diffusion regions constituting the plurality of first-conductivity-type regions of the second partial parallel pn layer.

5. The silicon carbide substrate according to claim 1, wherein the third partial parallel pn layer includes an epitaxial layer of a first conductivity type containing silicon carbide, a plurality of trenches reaching the second partial parallel pn layer from a surface of the epitaxial layer and terminating in the second partial parallel pn layer, and another epitaxial layer of a second conductivity type, embedded in the plurality of trenches, wherein portions of the epitaxial layer between adjacent trenches among the plurality of trenches constitute the plurality of first-conductivity-type regions of the third partial parallel pn layer, and said another epitaxial layer embedded in the plurality of trenches constitutes the plurality of second-conductivity-type regions of the third partial parallel pn layer.

6. The silicon carbide substrate according to claim 1, wherein
the second partial parallel pn layer has a periodic concentration distribution in the depth direction of the silicon carbide substrate.

7. The silicon carbide substrate according to claim 1, wherein
the first partial parallel pn layer and the third partial parallel pn layer each have a uniform impurity concentration in the depth direction, and
the second partial parallel pn layer has a periodic impurity concentration distribution in the depth direction.

8. A method of manufacturing the silicon carbide substrate according to claim 1, the method comprising:
preparing the starting substrate containing silicon carbide;
performing a first stacking process of forming the first partial parallel pn layer on the starting substrate by a trench embedding epitaxial process, the first partial parallel pn layer forming a first portion of the parallel pn layer;
performing a second stacking process of stacking the second partial parallel pn layer by a multi-stage epitaxial process on the first partial parallel pn layer, the second partial parallel pn layer forming a second portion of the parallel pn layer; and
performing a third stacking process of stacking the third partial parallel pn layer on the second partial parallel pn layer by another trench embedding epitaxial process, the third partial parallel pn layer being a third portion of the parallel pn layer, such that
the plurality of first-conductivity-type regions of the first and second partial parallel pn layers at least-partially face each other in the depth direction of the silicon carbide substrate, and the plurality of second-conductivity-type regions of the first and second partial parallel pn layers at least partially face each other in the depth direction.

9. The method according to claim 8, further comprising a first planarization process of planarizing a surface of the first partial parallel pn layer after the first stacking process but before the third stacking process.

10. The method according to claim 8, further comprising a second planarization process of planarizing a surface of the third partial parallel pn layer after the third stacking process.

11. A method of manufacturing a silicon carbide semiconductor device, comprising:
forming a drift layer of the silicon carbide semiconductor device, by manufacturing a silicon carbide substrate using the method of claim 8, the drift layer having a thickness of at least 30 µm, wherein
in the drift layer, the parallel pn layer has a thickness that is at least 80% of the thickness of the drift layer.

12. A silicon carbide substrate, comprising:
a starting substrate containing silicon carbide;
a parallel pn layer including
a first partial parallel pn layer stacked on the starting substrate,
a second partial parallel pn layer stacked on the first partial parallel pn layer, and
a third partial parallel pn layer stacked on the second partial parallel pn layer, wherein
each of the first, second and third partial parallel pn layers has a plurality of first-conductivity-type regions and a plurality of second-conductivity-type regions alternately disposed in parallel to a main surface of the starting substrate;
the plurality of first-conductivity-type regions and the plurality of second-conductivity-type regions of the third partial parallel pn layer are respectively adjacent to the plurality of first-conductivity-type regions and the plurality of second-conductivity-type regions of the second partial parallel pn layer;
the plurality of first-conductivity-type regions of the first and third partial parallel pn layers face each other in a depth direction of the silicon carbide substrate, and the plurality of second-conductivity-type regions of the first and third partial parallel pn layers face each other in the depth direction, wherein
crystal defects are formed in the plurality of second-conductivity-type regions of the second partial parallel pn layer or in an entire area of the second partial parallel pn layer;
the plurality of first-conductivity-type regions and the plurality of second-conductivity-type regions in each of the first, second and third partial parallel pn layers extend in a striped pattern parallel to the main surface, and are disposed to alternate one another along a direction orthogonal to a direction along which the striped pattern extends, and
a direction along which the striped pattern of the plurality of first-conductivity-type regions and the plurality of second-conductivity-type regions of the second partial parallel pn layer extends, and a direction along which the striped pattern of the plurality of first-conductivity-type regions and the plurality of second-conductivity-type regions of the first partial parallel pn layer extends, form an angle of at least 45 degrees.

13. The silicon carbide substrate according to claim 12, wherein
the direction along which the striped pattern of the plurality of first-conductivity-type regions and the plurality of second-conductivity-type regions of second partial parallel pn layer extends and the direction along which the striped pattern of the plurality of first-conductivity-type regions and the plurality of second-conductivity-type regions of the first partial parallel pn layer extends are orthogonal to each other.

14. The method according to claim 1, further comprising:
repeatedly performing the third stacking process, to thereby stack at least one additional third partial parallel pn layer on said third partial parallel pn layer, to be an additional portion of the parallel pn layer.

* * * * *